United States Patent
Yamazaki et al.

(10) Patent No.: US 7,300,516 B2
(45) Date of Patent: *Nov. 27, 2007

(54) LASER IRRADIATION METHOD AND LASER IRRADIATION APPARATUS, AND METHOD FOR FABRICATING SEMICONDUCTOR DEVICE

(75) Inventors: Shunpei Yamazaki, Tokyo (JP); Koichiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 393 days.

This patent is subject to a terminal disclaimer.

(21) Appl. No.: 10/962,468

(22) Filed: Oct. 13, 2004

(65) Prior Publication Data
US 2005/0048704 A1 Mar. 3, 2005

Related U.S. Application Data

(62) Division of application No. 10/279,875, filed on Oct. 25, 2002, now Pat. No. 6,808,969.

(30) Foreign Application Priority Data

Oct. 30, 2001 (JP) .............................. 2001-333402

(51) Int. Cl.
*C30B 28/02* (2006.01)
(52) U.S. Cl. ...................... 117/3; 117/4; 117/7; 117/10; 117/904; 117/930; 438/149; 438/151; 438/166; 438/308
(58) Field of Classification Search ............ 117/3, 117/4, 7, 10, 904, 930; 438/149, 151, 166, 438/308
See application file for complete search history.

(56) References Cited

U.S. PATENT DOCUMENTS 4,059,461 A * 11/1977 Fan et al. .................... 438/92

(Continued)

FOREIGN PATENT DOCUMENTS

JP          62-104117           5/1987

(Continued)

OTHER PUBLICATIONS

Australian Search Report dated Oct. 28, 2004 from Singapore Application No. SG 200206438-4.

(Continued)

*Primary Examiner*—Robert Kunemund
*Assistant Examiner*—Matthew J. Song
(74) *Attorney, Agent, or Firm*—Nixon Peabody LLP; Jeffrey L. Costellia

(57) ABSTRACT

When a laser beam is radiated on a semiconductor film under appropriate conditions, the semiconductor film can be crystallized into single crystal-like grains connected in a scanning direction of the laser beam (laser annealing). The most efficient laser annealing condition is studied. When a length of one side of a rectangular substrate on which a semiconductor film is formed is b, a scanning speed is V, and acceleration necessary to attain the scanning speed V of the laser beam relative to the substrate is g, and when $V=(gb/5.477)^{1/2}$ is satisfied, a time necessary for the laser annealing is made shortest. The acceleration g is made constant, however, when it is a function of time, a time-averaged value thereof can be used in place of the constant.

11 Claims, 20 Drawing Sheets

U.S. PATENT DOCUMENTS

| | | | |
|---|---|---|---|
| 4,330,363 A | 5/1982 | Biegesen et al. | |
| 5,306,651 A | 4/1994 | Masumo et al. | |
| 5,504,612 A | 4/1996 | Cobb et al. | |
| 5,532,731 A | 7/1996 | Mihara et al. | |
| 5,643,826 A | 7/1997 | Ohtani et al. | |
| 5,953,597 A | 9/1999 | Kusumoto et al. | |
| 6,204,099 B1 | 3/2001 | Kusumoto et al. | |
| 6,265,745 B1 | 7/2001 | Kusumoto et al. | |
| 6,808,969 B2 * | 10/2004 | Yamazaki et al. | 438/166 |
| 2002/0094008 A1 | 7/2002 | Tanaka | |

FOREIGN PATENT DOCUMENTS

| | | |
|---|---|---|
| JP | 62-216320 | 9/1987 |
| JP | 02-181419 | 7/1990 |
| JP | 7-183540 | 7/1995 |
| JP | 08-195357 | 7/1996 |
| JP | 2001-316802 | 11/2001 |
| JP | 2002-289524 | 10/2002 |

OTHER PUBLICATIONS

Hara, et al. "Ultra-high Performance Poly-Si TFTs on a Glass by a Stable Scanning CW Laser Lateral Crystallization" TFT3-1, AM-LCD '01, pp. 227-230, date unknown.

Takeuchi, et al. "Performance of poly-Si TFTs fabricated by a Stable Scanning CW Laser Crystallization" TFT4-3, AM-LCD '01, pp. 251-254, date unknown.

* cited by examiner

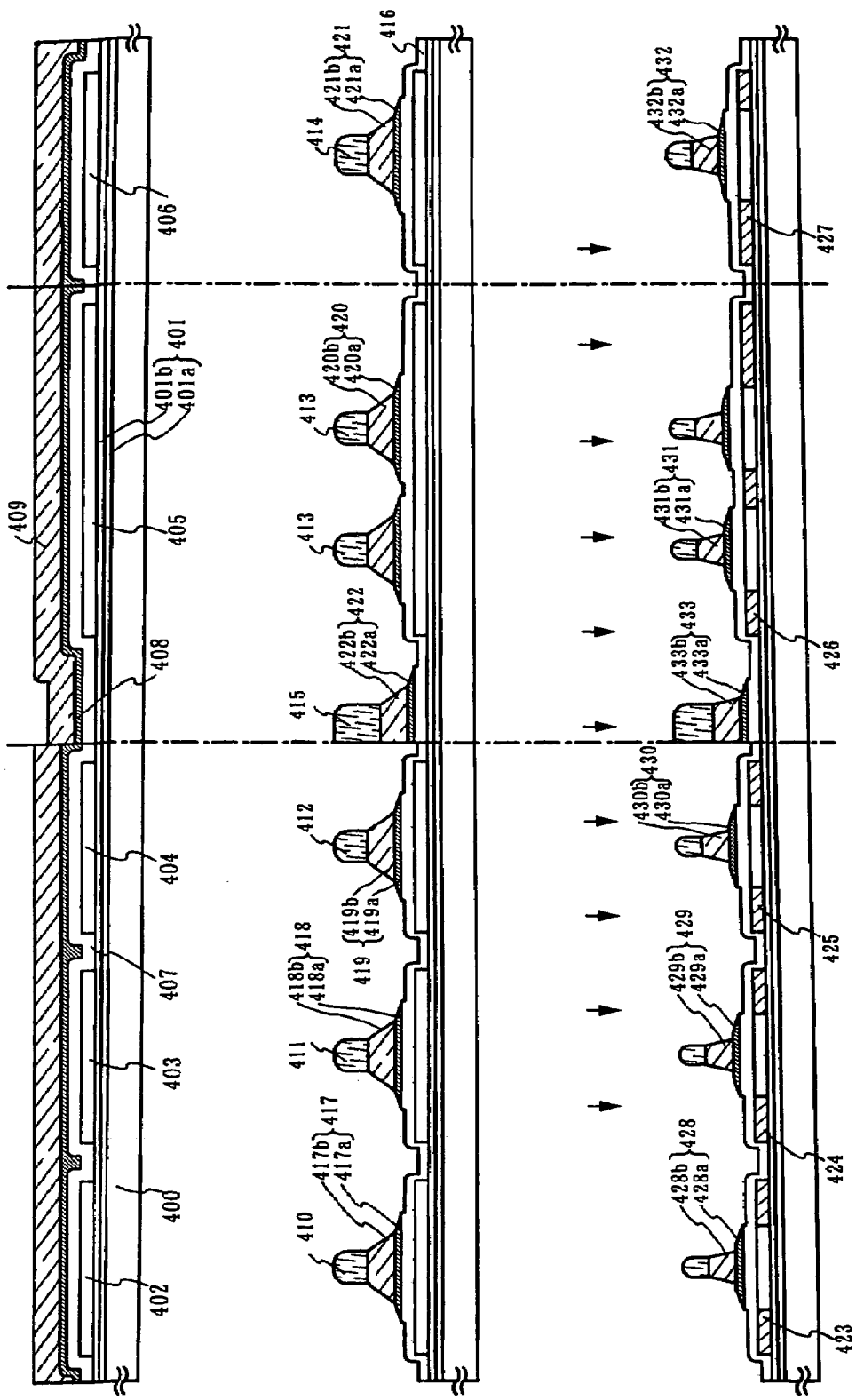

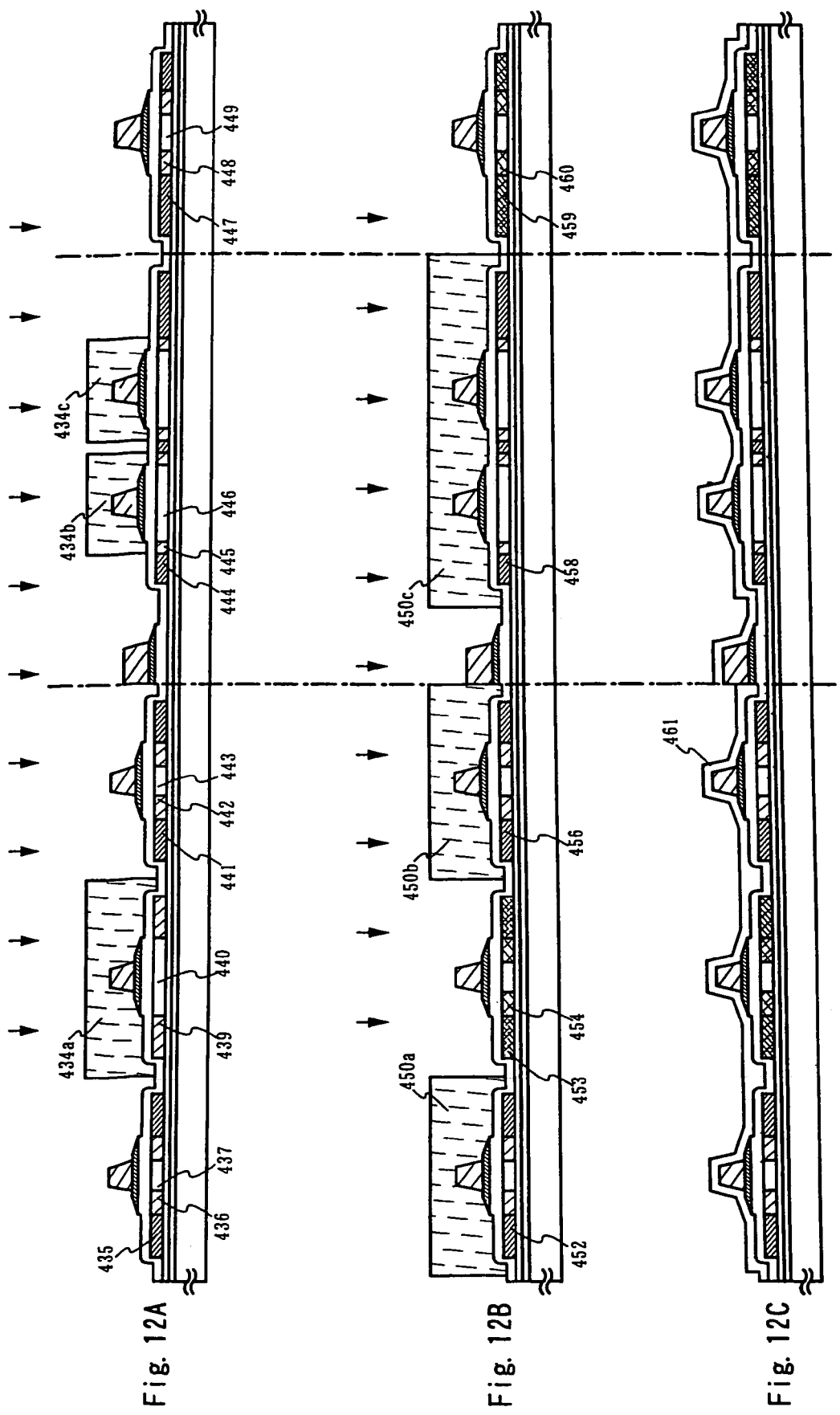

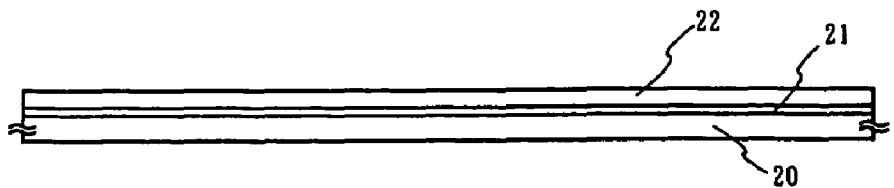
Fig. 20A
Fig. 20B
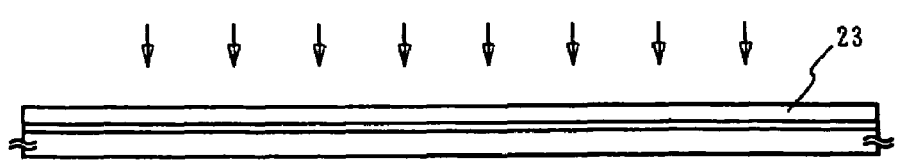
Fig. 21A
Fig. 21B
Fig. 21C

LASER IRRADIATION METHOD AND LASER IRRADIATION APPARATUS, AND METHOD FOR FABRICATING SEMICONDUCTOR DEVICE

CROSS-REFERENCE TO RELATED APPLICATIONS

This application is a divisional of U.S. application Ser. No. 10/279,875 filed on Oct. 25, 2002, now U.S. Pat. No. 6,808,969, issued Oct. 26, 2004, and claims the benefit of Japanese Application No. 2001-333402, filed Oct. 30, 2001.

BACKGROUND OF THE INVENTION

1. Field of the Invention

The present invention relates to a laser beam irradiation method and a laser irradiation apparatus for using the method (apparatus including a laser and an optical system for guiding laser beam emitted from the laser to an object to be illuminated). In addition, the present invention relates to a method of manufacturing a semiconductor device, which includes a laser beam irradiation step. Note that a semiconductor device described here includes an electro-optical device such as a liquid crystal display device or a light-emitting device, and an electronic device that includes the electro-optical device as a part.

2. Description of the Related Art

In recent years, an extensive study has been made on a technique in which an amorphous semiconductor film formed on an insulating substrate made of glass or the like is crystallized so that a semiconductor film having crystal structure (hereafter referred to as crystalline semiconductor film) is obtained. As the methods of crystallization such as a thermal annealing method using furnace annealing, a rapid thermal annealing method (RTA method), a laser annealing method and the like were examined. Anyone thereof or combining two or more methods thereof can be carried out for crystallization.

In comparison with an amorphous semiconductor, a crystalline semiconductor film has extreme high mobility. Since thus, the crystalline semiconductor film is used to form a thin film transistor (referred to as TFT), for example, the TFT can be widely used in an active matrix liquid crystal display device in which TFTs for pixel portion, TFTs for pixel portion and TFTs for driver circuit are formed on one glass substrate.

Generally, in order to crystallize an amorphous semiconductor in annealing furnace, a thermal treatment at 600° C. or more for 10 hours or more is required. A quartz is an applicable material of substrate for this crystallization, but the quartz substrate is too expensive in price to be manufactured especially in a large area. In order to improve the productivity efficiency, manufacturing the substrate in a large area is unavoidable, it is expected that a substrate in which a length of one side exceeds 1 m will be also used in recent years.

On the other hand, a method of thermal crystallization by using metal elements disclosed in Japanese Patent Application Laid Open No. 7-183540 enable the crystallization temperature which was a conventional problem to be realized at a low temperature. The crystalline semiconductor film can be formed by this method in which a small amount of an element such as nickel, palladium and lead is added to an amorphous semiconductor film, then the amorphous semiconductor film is heated for four hours at 550° C.

Since the laser annealing method can deliver high energy only to the semiconductor film without substantially increasing the temperature in substrate, the laser annealing technology comes under spotlight by its appliance in a glass substrate with a low strain point as a matter of course, and a plastic substrate, etc.

An example of the laser annealing method is a method of forming pulse laser beam from an excimer laser or the like by an optical system such that it becomes a square spot of several cm or a linear shape of 100 mm or more in length on a surface being illuminated, and relatively shifting an irradiation position of the laser beam with respect to the surface being illuminated to conduct annealing. The "linear shape" described here means not a "line" in the strict sense but a rectangle (or a prolate ellipsoid shape) having a high aspect ratio. For example, although, it indicates a shape having an aspect ratio of 2 or more (preferably, 10 to 100), it doesn't make any difference from that a shape at a surface being illuminated is being contained in the laser light having rectangular shape (rectangular shape beam). Note that the linear shape is used to obtain an energy density required for annealing an object sufficiently to be illuminated. Thus, if sufficient annealing is conducted for the object to be illuminated, it may be a rectangular shape and a tabletop shape.

However, a crystalline semiconductor film formed by subjecting an amorphous semiconductor film to laser annealing includes a collection of a plurality of crystal grains, and the position and size of the crystal grains are random. TFTs are formed on a glass substrate by patterning the crystalline semiconductor layer in an island shape for device separation. In this case, the position and size of crystal grains cannot be specified. In comparison with the inner of crystal grains, the interface of crystal grains has an infinite number of a recombination centers or a trapping centers caused by an amorphous structure, a crystal defect, and the like. If the carriers are trapped in trapping centers, potential at a grain boundary will be increased and become barriers to carriers, it is known that current transporting characteristics of carriers will be degraded caused by this. However, it is almost impossible to form a channel formation region by using a single crystal semiconductor film while avoiding the influence of a crystal boundary, although crystal characteristics of semiconductor film of channel formation region have a serious effect on the TFT characteristics.

There is a crystal growth technology that is recently attracting attention. In the technology, when a CW laser is illuminated on a semiconductor film with the CW laser scanning in one direction, crystal grains grow connected in the scanning direction thereof, resulting in forming a single crystal elongated in that direction. It is considered that when this method is applied, a semiconductor film that has no grain boundary at least in a channel direction of a TFT can be formed. However, in this method, since a CW laser having a wavelength in a region that can be sufficiently absorbed by the semiconductor film is used, only a laser that is very small in its output such as substantially 10 W can be applied. Accordingly, in view of productivity, it is inferior to technology that uses an excimer laser.

SUMMARY OF THE INVENTION

The present invention intends to provide a method for, with a CW laser, illuminating a laser light with high production efficiency and a laser irradiation apparatus for carrying out the irradiation of the laser light. In addition, the present invention also intends to provide a method for fabricating a semiconductor device by use of a semiconductor film obtained by carrying out the laser irradiation like this.

In a process of crystallizing a semiconductor film with a CW laser, in order to improve the productivity even a little, the following is actively carried out. That is, a laser beam is processed into a long ellipse in a surface being illuminated and the processed laser beam is scanned in a minor axis direction of the elliptical laser beam (hereinafter referred to as an elliptical beam), and thereby the semiconductor film is crystallized. The present invention intends to provide a method for illuminating an elliptical beam with the highest productivity in the process like this.

The CW laser suitable for the present method is one that has an wavelength in the range of 550 nm or less and a remarkably high output stability, for instance, second harmonics of a $YVO_4$ laser, second harmonics of a YAG ($Nd^{3+}$: YAG, $Cr^{4+}$: YAG) laser, second harmonics of a YLF laser, second harmonics of a glass laser, second harmonics of a $YalO_3$ laser, second harmonics of a $Y_2O_3$ ($Nd^{3+}$:$Y_2O_3$, $Yb^{3+}$:$Y_2O_3$) laser, laser being applicable. Alternatively, further higher order harmonics of the above lasers may be used. Further alternatively, lasers such as a ruby laser, an alexandrite laser, a Ti: sapphire laser, a CW excimer laser, an Ar laser, a Kr laser, a $CO_2$ laser, a CW helium-cadmium laser, a copper vapor laser, and a gold vapor laser may be used. A plurality of one kind of these lasers or a plurality of kinds of these lasers may be used.

First, a 10 W $YVO_4$ laser (CW, the second harmonics, $TEM_{00}$) is prepared and a beam shape thereof is processed with a convex lens having a focal length of 20 mm into an elliptical beam. Specifically, a laser beam is obliquely entered in the convex lens and processed into a slender elliptical beam by use of astigmatism or the like. The present experiment will be explained with reference to FIG. 2. In the present experiment, a laser beam exited from a laser oscillator 201 is reflected by a mirror 202, and entered into a convex lens 203 at an angle of incidence of 20 degree, and an elliptic beam 205 having a major axis of substantially 500 µm and a minor axis of substantially 30 µm is formed on a semiconductor film 204 disposed on an surface being illuminated in parallel with the convex lens 203. Though an irradiation efficiency can be improved by further shortening the minor axis and thereby lengthening the major axis, since as a length of the minor axis becomes shorter a focal depth becomes shallower, and a uniform laser annealing becomes difficult to perform, the above sizes are considered appropriate.

When the semiconductor film 204 is scanned in a direction of the minor axis of the elliptical beam 205, in a region having a width of 150 µm in a major axis direction of the elliptical beam, grains extended in a scanning direction are formed closely packed. Hereinafter, the region is referred to as a width of a long grain region. The semiconductor film is formed on a glass substrate. Specifically, on one surface of a glass substrate having a thickness of 0.7 mm, silicon oxynitride is deposited with a thickness of 200 nm, and thereon an a-Si film having a thickness of 150 nm is deposited by use of the plasma CVD method. Furthermore, in order to improve resistance properties of the semiconductor film against the laser, the semiconductor film is exposed to thermal annealing at 500 degree centigrade for 1 hr. Other than the thermal annealing, as mentioned above in a section of "Related Art", the crystallization of the semiconductor film due to a metal element may be performed. In either one of these, optimum laser irradiation conditions are similar.

FIG. 3 is a graph showing relationship between a scanning speed of a semiconductor film and an optimum laser output for crystallizing the semiconductor film. A vertical axis shows the optimum laser output (unit: W), and a horizontal axis shows the scanning speed of the semiconductor film (unit: cm/s). In the present experiment, the maximum value of the scanning speed is 100 cm/s. From the graph, it is found that there is a linear relationship between the scanning speed and the output. For convenience of comparison with later experiments, from the graph shown in FIG. 3, it is estimated that when the laser output is 10 W, the optimum scanning speed of the semiconductor film is substantially 150 cm/s.

FIG. 4 shows an optical system in which a major axis of the elliptical beam is further elongated. Thereby, an elliptical beam 406 having a major axis of 700 µm and a minor axis of 30 µm can be formed. In the present specification, in order to standardizing experimental results, the minor axis of the elliptical beam is fixed at 30 µm. A specific configuration of the optical system includes a laser oscillator 401, a mirror 402 that deflects a light path to a vertical direction, a cylindrical lens 403 that adjusts a length of the major axis of the elliptical beam and has a focal length of 150 mm, and a cylindrical lens 404 that adjusts a length of the minor axis and has a focal length of 20 mm. The cylindrical lens 403 is disposed 120 mm above the semiconductor film 405, and the cylindrical lens 404 is disposed so that a focal point thereof may converge on the semiconductor film 405. The cylindrical lenses 403 and 404 and the semiconductor film 405 are disposed perpendicularly to an optical axis of the laser beam.

When the elliptical beam 406 is scanned in a minor axis direction of the elliptical beam relative to the semiconductor film 405 and thereby the semiconductor film 405 is crystallized, a state where, in a region having a width of 250 µm in the major axis direction of the elliptical beam, grains elongated in the scanning direction are closely packed can be formed. The optimum scanning speed at this time is 50 cm/s and the laser output is 10 W.

An optical system where the major axis of the elliptical beam is further elongated is shown in FIG. 5. Thereby, an elliptical beam 505 having a major axis of 2000 µm and a minor axis of 30 µm can be formed. A specific configuration of the optical system includes a laser oscillator 501, a mirror 502 that deflects a light path into a vertical direction, and a cylindrical lens 503 that adjusts a length of the minor axis of the elliptical beam and has a focal length of 20 mm. The cylindrical lens 503 is disposed so that a focal point may converge on the semiconductor film 504. The cylindrical lens 503 and the semiconductor film 504 are disposed so as to be at a right angle relative to the optical axis of the laser beam.

When the elliptical beam 505 is scanned in a minor axis direction of the elliptical beam relative to the semiconductor film 504 to crystallize the semiconductor film 504, a state where, in a region having a width in the range of 600 to 800 µm in the major axis direction of the elliptical beam, grains elongated in the scanning direction are closely packed can be formed. The optimum scanning speed at this time is 5 to 10 cm/s and the laser output is 10 W.

A series of experimental results are shown in a graph of FIG. 6. Specifically, FIG. 6 shows the relationship between the optimum scanning speed of the crystallization of the semiconductor film and the width of the region of grains in the major axis direction of the formed elliptical beam when the laser output is fixed at 10 W and the width of the elliptical beam is set at 30 µm. An irradiation target is the aforementioned a-Si film having a thickness of 150 nm. The vertical axis shows the scanning speed V (unit: cm/s) of the semiconductor film and the horizontal axis shows the width L (unit: μm) of the long grain region. When both are shown on a full logarithmic plot, the relationship between these becomes substantially linear.

When the relationship between these is expressed with an equation, $$\log L = -0.465 \log V + 3.188 \qquad \text{Equation 1)}$$

can be obtained. In the present specification, for convenience of understanding, unit of the width L of the long grain region and that of the scanning speed V are made different. However, same unit may be employed, and in that case, only a constant term in the Equation 1) becomes different. Accordingly, except for the constant term, it can be said that the Equation 1) holds for any unit-systems.

On the other hand, when a time necessary for laser annealing is shown by T, T can be expressed as follow:

$$T = (a/L) \times (b/V + 2V/g) \qquad \text{Equation 2)}$$

(where a is a length (unit: μm) of a shorter side when the semiconductor film is assumed to be rectangular, and b is a length (unit: cm) of a longer side when the semiconductor film is assumed to be rectangular, and g is acceleration (unit: cm/s²) necessary for the scanning speed to reach a velocity V). A factor 2 of the Equation 2) denotes an acceleration period and a deceleration period. Since the units of the a and L are unified, a/L is dimensionless. Accordingly, even in Equation 2), when all unit systems are unified, the same result can be obtained.

When an entire surface of a semiconductor film formed on a rectangular substrate is laser-annealed according to the present invention, it is obvious that when the elliptical beam is scanned along a longer side of a rectangular substrate the laser annealing can be most efficiently performed. At this time, a major axis of the elliptical beam is arranged so as to be in parallel with a shorter side of the substrate. When thus arranged, the number of times of the acceleration and deceleration of the scanning can be made the least. Accordingly, in Equation 2), it is assumed that a denotes a shorter side of a rectangle and b denotes a longer side thereof. However, since the crystal grain develops in a scanning direction of the laser beam, when in a rectangular substrate a semiconductor element in which grains elongated in the shorter side direction is necessary, there is no problem when a and b may replace each other.

Here, with reference to FIGS. 7A and 7B, the Equation 2) will be explained. In FIG. 7A, with an elliptical beam 7002, a semiconductor film 7001 is scanned in the direction shown with an arrow in the drawing. Since this movement is relative, either the elliptical beam 7002 or the semiconductor film 7001 may be moved or both may be moved. There is no essential difference among these. Since when the scanning speed of the semiconductor film 7001 is slow, a period necessary for the acceleration can be made substantially zero, g becomes infinity. However, since when the semiconductor film is scanned the semiconductor film is necessary to make reciprocating movement, as the scanning speed of the semiconductor film becomes larger, under an influence of the acceleration at both ends of the reciprocating movement, it becomes to take an excessive processing time T. That is, in addition to an irradiation time period (one shown by a region of a scanning distance b in FIG. 7B; the scanning speed at this time is constant), a longer acceleration time period (one shown by a region of a scanning distance c in FIG. 7B) is required. In the present specification, although g is treated as a constant, it is of course no problem even when the g is a function of time. In such case, g(t) can be time-averaged and thereby can be treated as a constant.

When logarithms of both sides of the Equation 2) are taken, $$\log T = \log a - \log L + \log (b/V + 2V/g) \qquad \text{Equation 3)}$$

is obtained.

When L is eliminated from Equation 1) and Equation 3), $$\log T = \log (b/V^{0.535} + 2V^{1.465}/g) + A \qquad \text{Equation 4)}$$

is obtained. Here, A is a constant (it is obvious from A=−3.188+log a). In the above equation, the variable L depends on an output (10 W in this case), and when a minor axis of the elliptical beam is set at a constant, there is a substantial linear relationship. However, the variation of the output causes no difference in the meaning of the equation. When the output varies, only the constant term A of the equation varies. Accordingly, when a scanning speed V that minimizes the Equation 4) is obtained, it is obvious that whatever laser outputs may be, the obtained speed V makes a time necessary for the laser annealing the shortest. That is, the present invention provides the V that makes the Equation 4) smallest, or the V that can make the time necessary for laser annealing shortest.

When the Equation 4) is differentiated with respect to V, $$(\log T)' = f(V)(5.477/g - b/V^2) \qquad \text{Equation 5)}$$

is obtained (here, f(V) is a function of V).

In order to carry out the laser annealing most efficiently, since the T need only take the least value, when the Equation 5) is equated to zero followed by calculation, $$V = (gb/5.477)^{1/2} \qquad \text{Equation 6)}$$

is obtained. That is, the laser annealing need only be carried out at the scanning speed V in conformity with the Equation 6).

A substrate used normally in the production line is a rectangular one having a size of, for instance, substantially 600 mm×720 mm. Accordingly, the longer side of the rectangle corresponds to b (=72). In an ordinary XY stage, since an acceleration is in the range of 10 to 1000 cm/s², when the acceleration g is set at, for instance, 250 cm/s², the V derived from the Equation 6) becomes 57 cm/s.

FIGS. 10A through 10C show relationship between the time period necessary for the laser annealing and the scanning speed of the semiconductor film. When the laser annealing is carried out at the V that is substantially one half to twice the scanning speed V calculated from the Equation 6), that is, in the range surrounded by solid lines in FIGS. 10A through 10C, the laser annealing can be efficiently carried out in a time that is substantially 1.3 times or less the time necessary for the shortest laser annealing. Accordingly, the laser annealing need only be carried out in the range of $$(gb/5.477)^{1/2}/2 < V < 2 \times (gb/5.477)^{1/2} \qquad \text{Equation 7)}.$$

Preferably, when the laser annealing is carried out at the V in the range of substantially 90% to 110% of the scanning speed calculated from Equation 6), that is, in the range surrounded by the dashed lines in FIGS. 10A through 10C, the laser annealing can be performed in a time substantially the same as that of the shortest annealing and as efficiently as that. Accordingly, the laser annealing may be carried out in the range of $$0.9 \times (gb/5.477)^{1/2} < V < 1.1 \times (gb/5.477)^{1/2} \qquad \text{Equation 8)}.$$

Although the sizes of the substrates normally used are various such as 300×400 mm, 550×650 mm, (600 to 620 mm)×720 mm, 730×920 mm, 1000×1200 mm and 1150× 1350 mm, whatever size of the substrate is used, the above calculation can be applied. Furthermore, although the calculation is conditioned on the elliptical beam, it is of course that the calculation can be applied to a shape close to this, such as, for instance, a rectangular shape or a bobbin-like shape. In order to get a rectangular beam, for instance, a slab type laser oscillator can be used. In order to obtain a bobbin-like beam, for instance, aberration of a lens can be used to form it.

BRIEF DESCRIPTION OF THE DRAWINGS

FIGS. 11A through 11C are sectional views showing a process for fabricating a pixel TFT and driver circuit TFT.

FIGS. 12A through 12C are sectional views showing a process for fabricating a pixel TFT and driver circuit TFT.

FIGS. 20A and 20B are diagrams showing an example of a crystallization process of a semiconductor film according to the present invention.

FIGS. 21A to 21C are diagrams showing an example of a crystallization process of a semiconductor film according to the present invention.

DESCRIPTION OF THE PREFERRED EMBODIMENTS

Implementation Mode of the Present Invention

Figure 1:
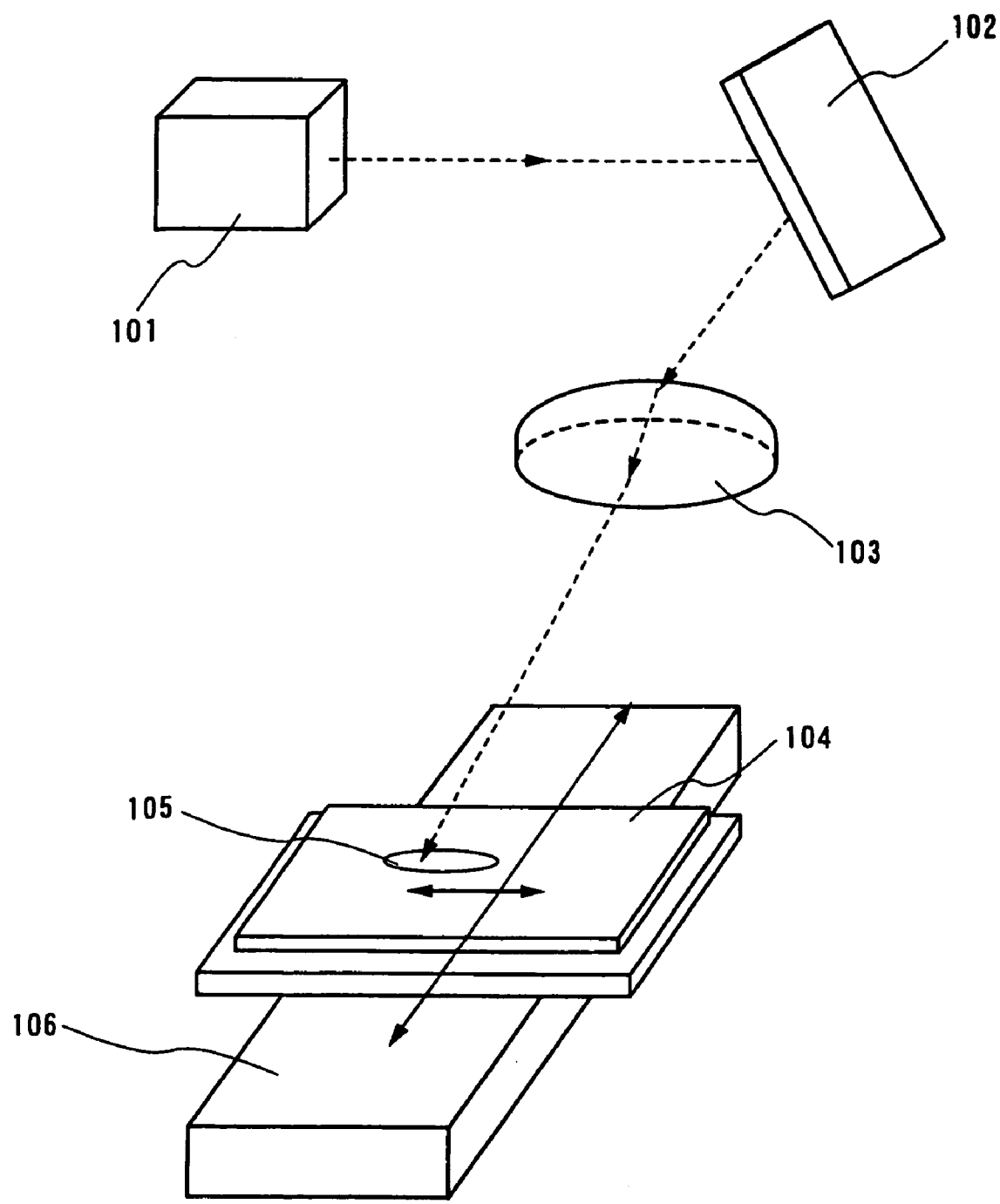
FIG. 1 is a diagram for explaining an implementation mode of the present invention.
Figure 2:
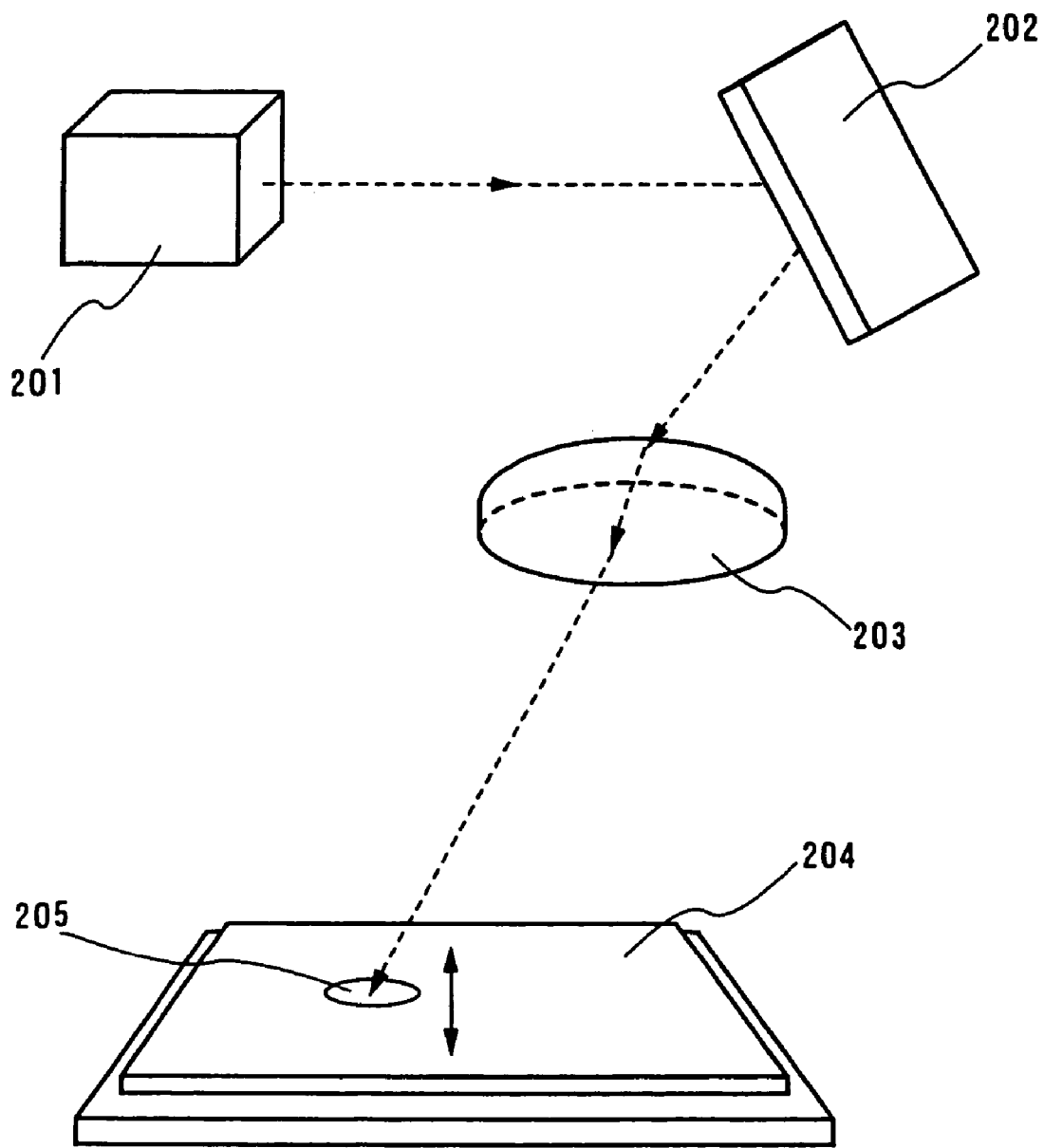
FIG. 2 is a diagram showing an example of a laser irradiation apparatus.
Figure 3:
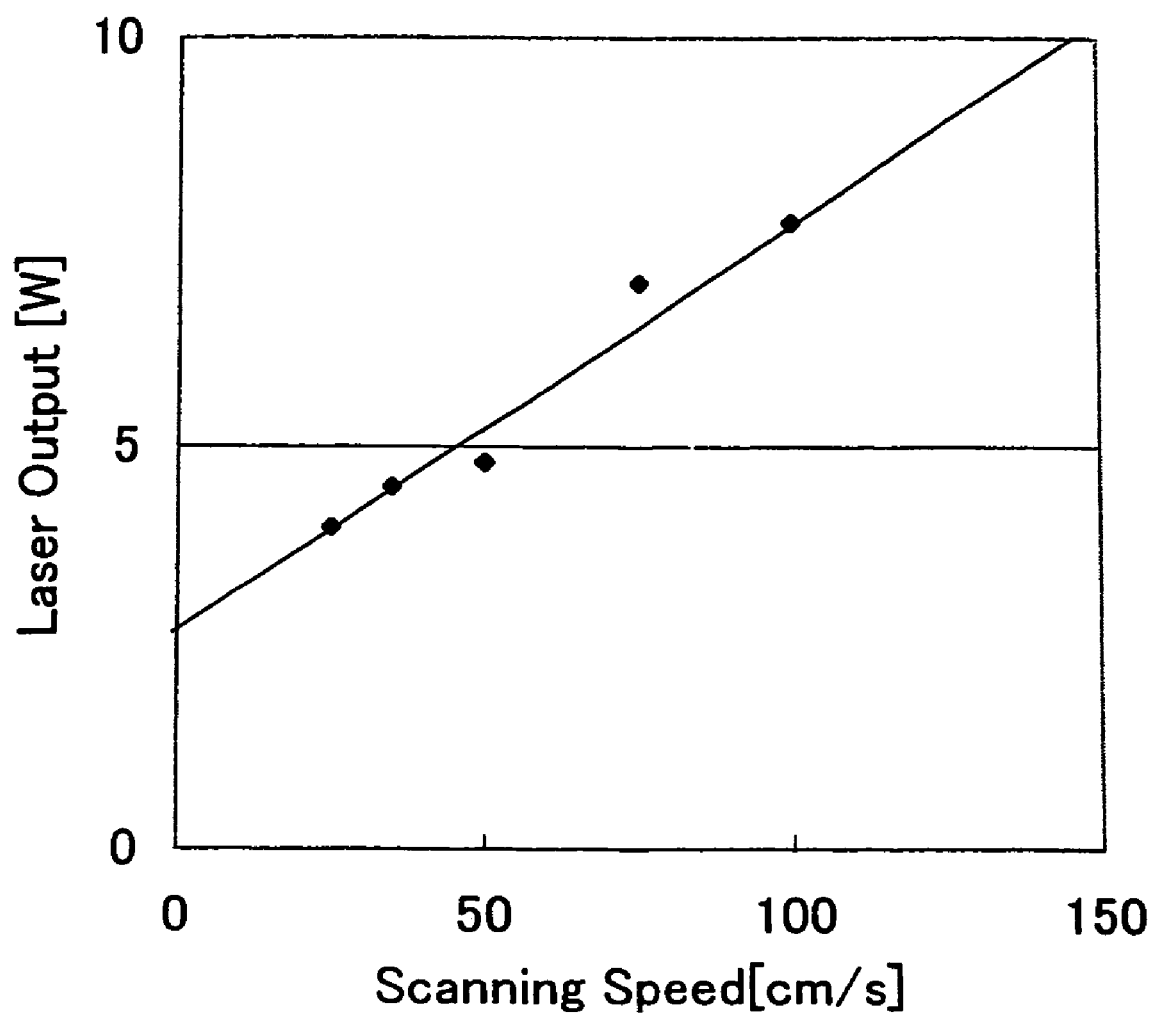
FIG. 3 is a graph showing relationship between laser output and scanning speed.
Figure 4:
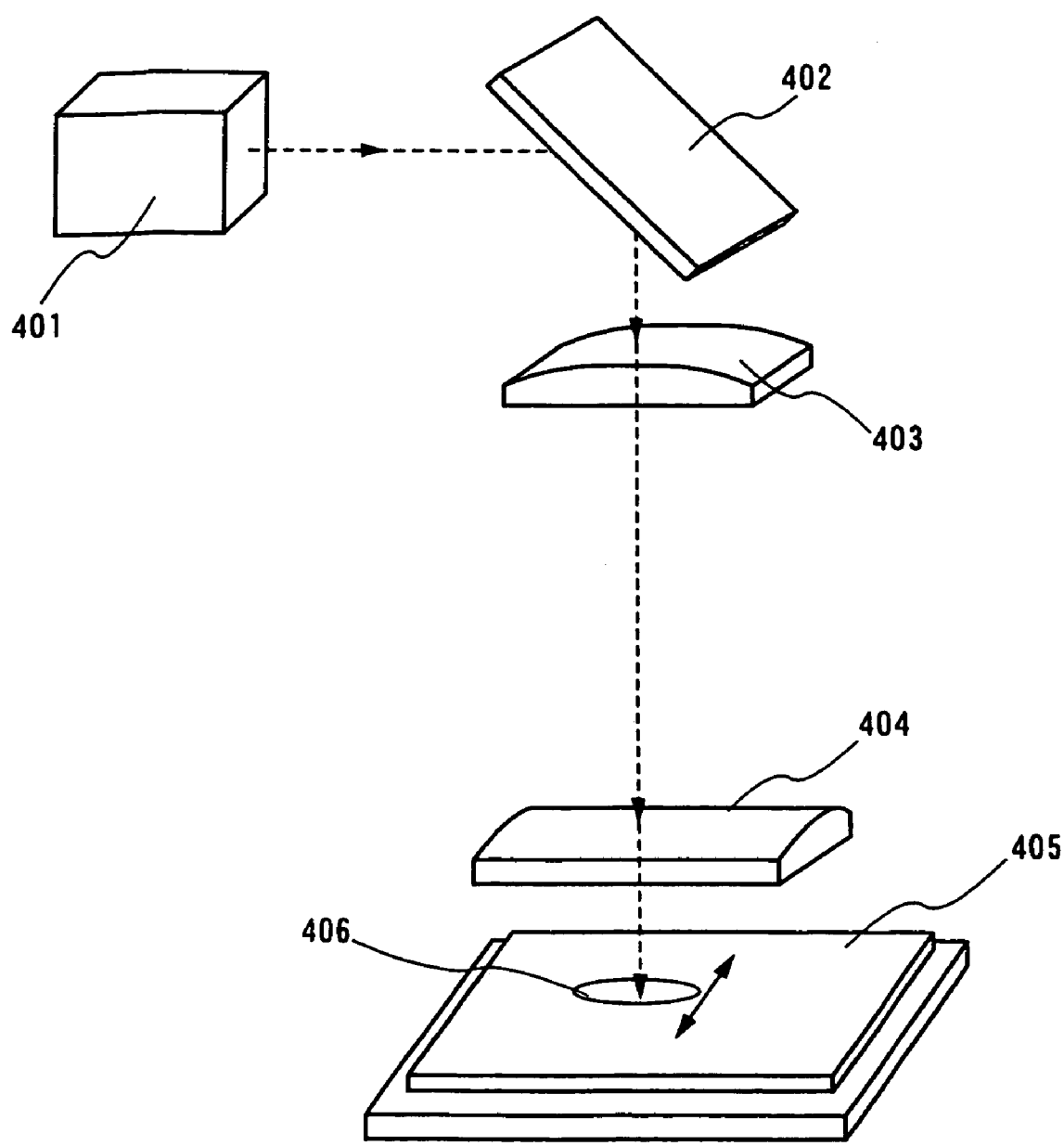
FIG. 4 is a diagram showing an example of a laser irradiation apparatus.
Figure 5:
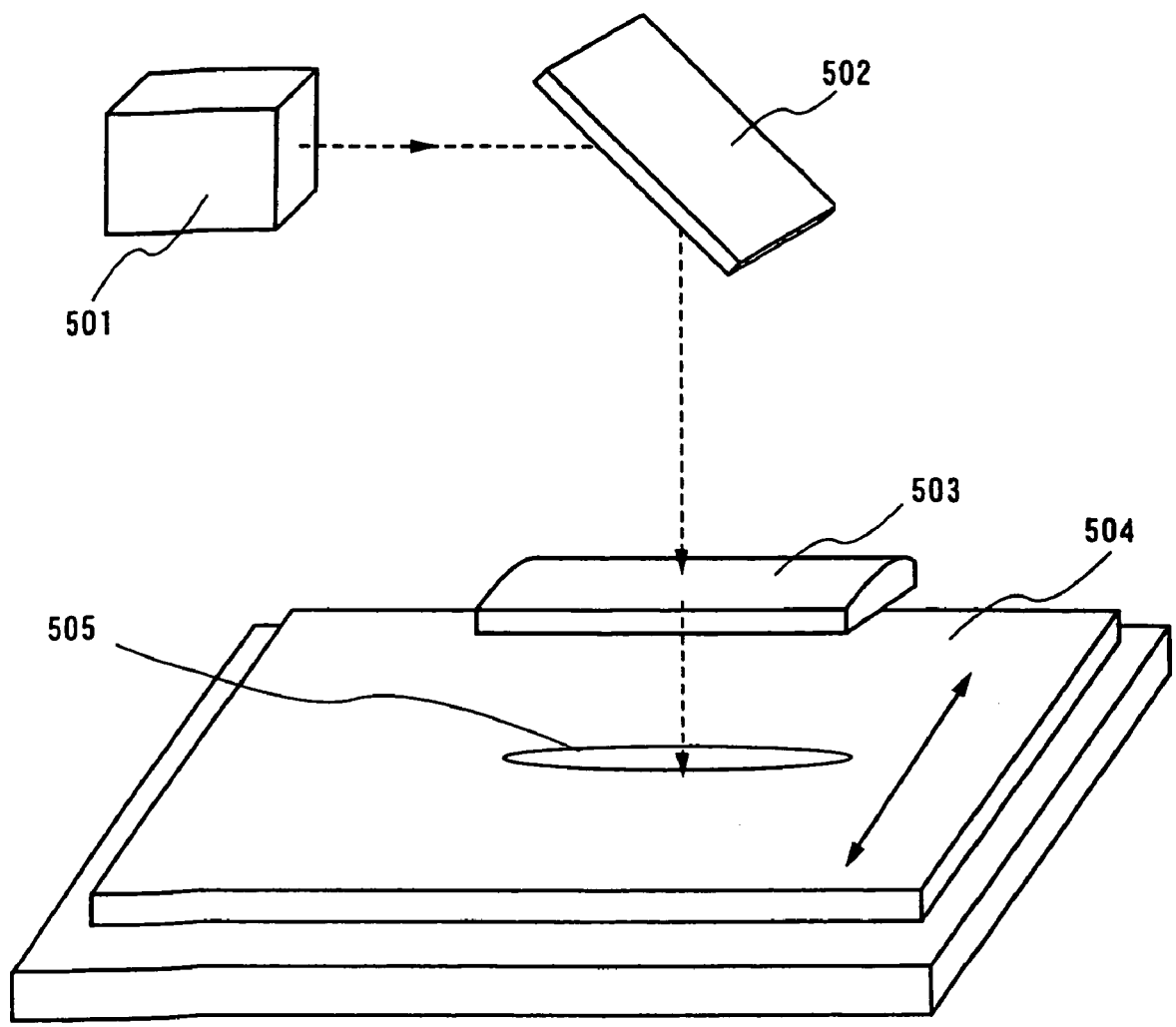
FIG. 5 is a diagram showing an example of a laser irradiation apparatus.
Figure 6:
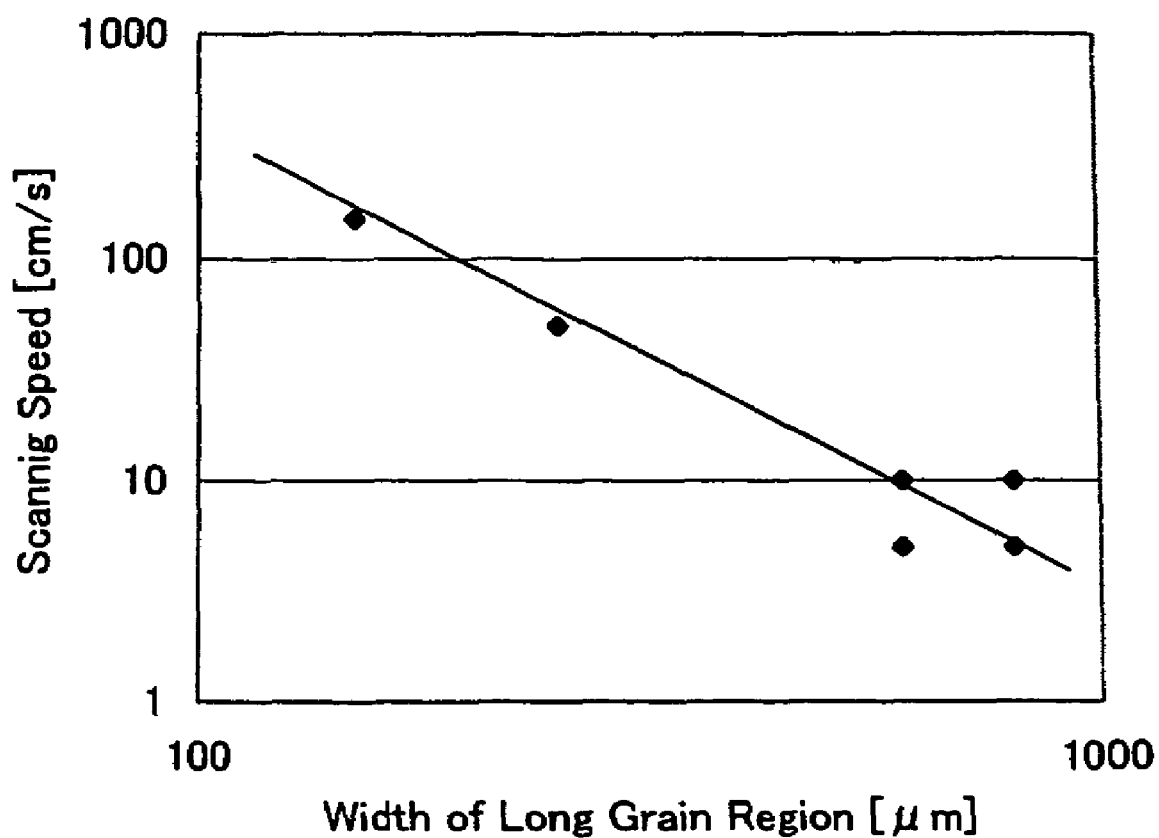
FIG. 6 is a graph showing relationship between scanning speed and width of longer grain region.
Figure 7A:
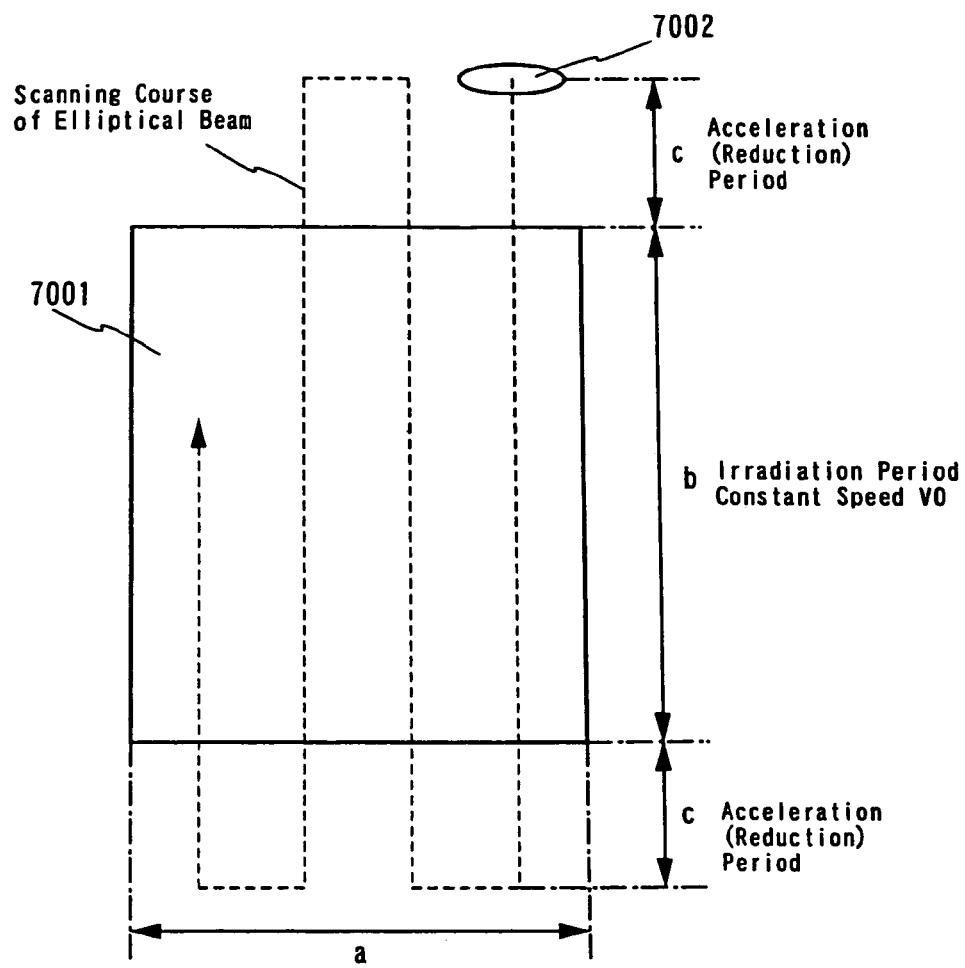
FIGS. 7A and 7B are diagrams showing conditions of laser annealing.
Figure 7B:
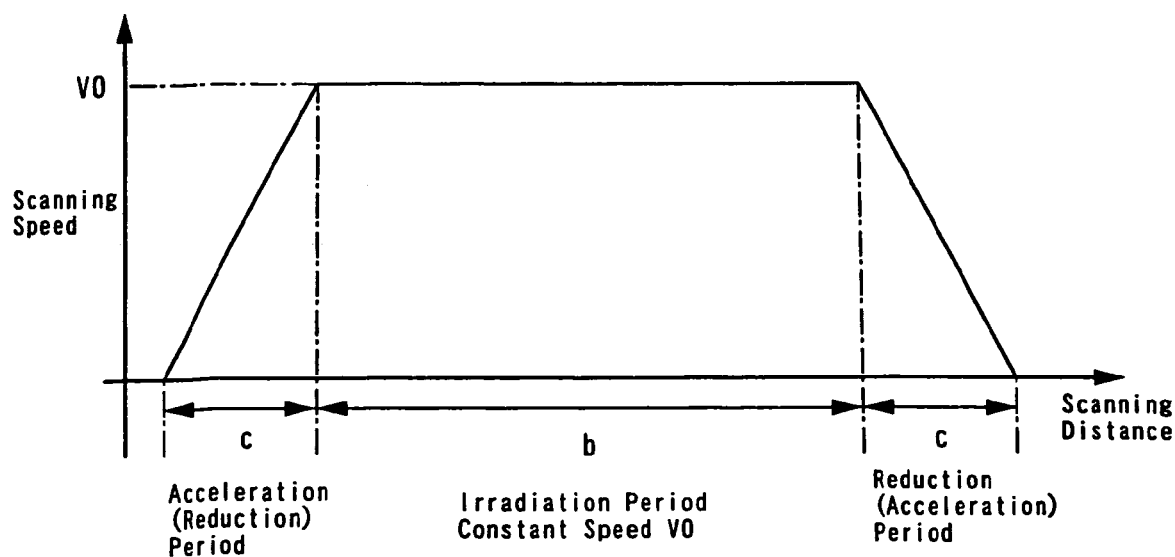

For the implementation mode of the present invention, an example where the laser annealing can be most efficiently carried out will be explained. Specifically, an example in which scanning is performed at the speed of 150 cm/s will be explained. with reference to FIG. 1. A laser oscillator 101 is a continuous wave type 10 W $YVO_4$ laser. A non-linear optical element is incorporated in a resonator, and second harmonics are emitted therefrom.

A laser beam emitted in a horizontal direction from the laser oscillator 101 is deflected by a mirror 102 into a direction of 20 degree from a vertical direction. Thereafter, the laser beam is converged with a convex lens 103 having a focal length of 20 mm and disposed in a horizontal direction. A surface being illuminated 104 where a semiconductor film is disposed is disposed at a position of the focal point of the convex lens 103. Furthermore, the surface being illuminated 104 is disposed in parallel with the convex lens 103. Thereby, an elliptical beam having a length of 500 μm and a width of 30 μm can be formed. The reason for the beam becoming an ellipse in the surface being illuminated is due to astigmatism. Here, as an example, laser-annealing of the a-Si film having a thickness of 150 nm will be illustrated, the fabrication process thereof being described in the section of "SUMMARY OF THE INVENTION". In this case, a long grain region having a width of 150 μm is formed.

Figure 10A:
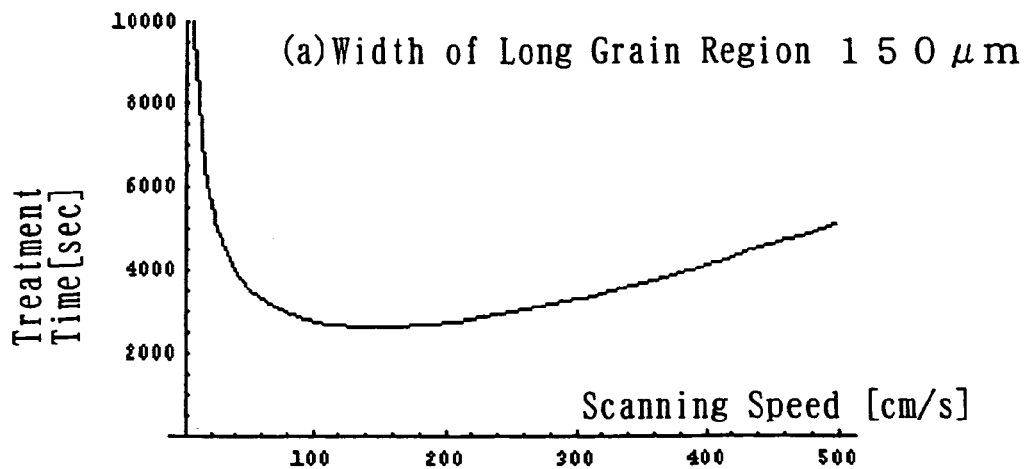
FIGS. 10A through 10C are graphs showing relationship between scanning speed of elliptical beam and processing time.
Figure 10B:
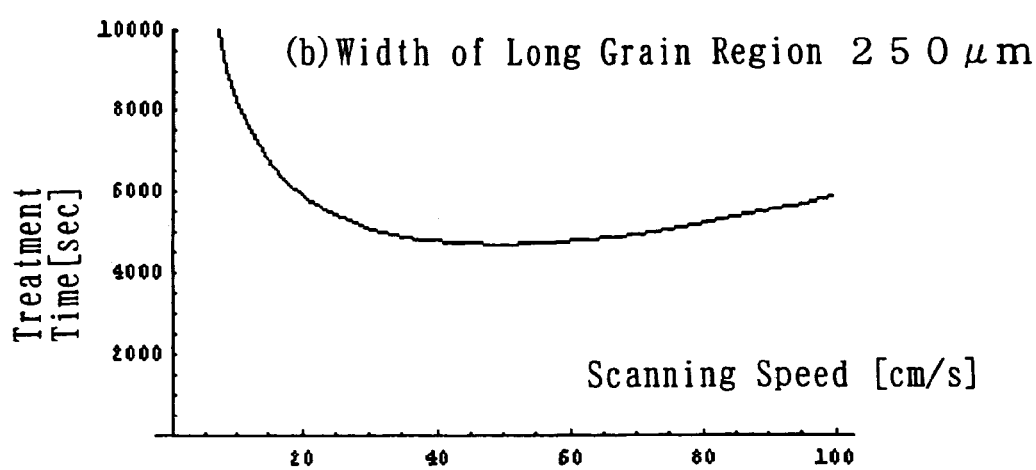
Figure 10C:
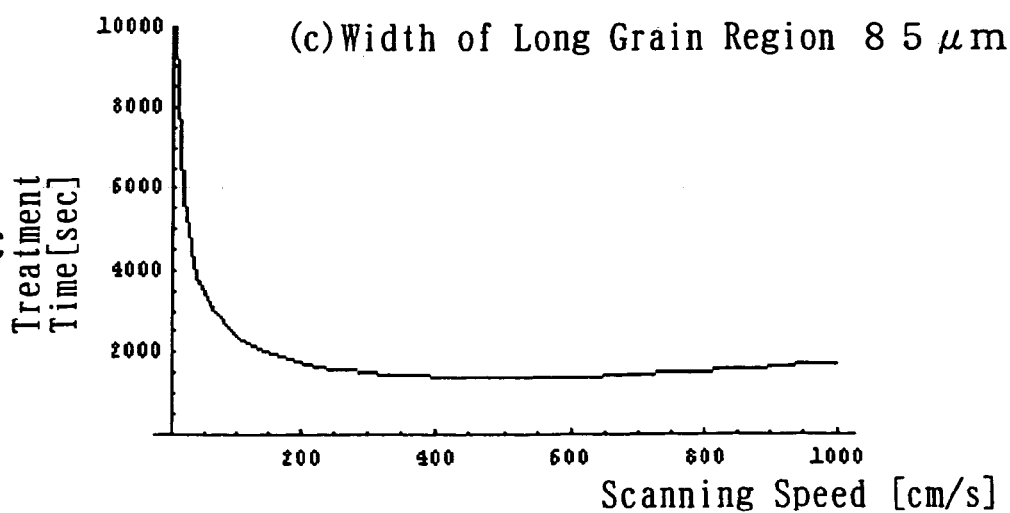

In order to closely pack the semiconductor film with the longer grain regions, the elliptical beam must be moved by 150 μm in the major axis direction thereof, to repeat scanning the substrate. This movement can be easily performed when an XY stage is employed. When a size of a semiconductor film that is a target to be illuminated is 600×720 mm, since a length of a short side of the substrate is 600 mm, the entire surface of the substrate can be laser-annealed by scanning 4000 times (2000 times reciprocating movement) with the elliptical beam. Furthermore, at this time, a condition where the scanning speed of 150 cm/s is the most efficient speed, is, from Equation 6), the case of g=substantially 1700 $cm/s^2$. It is understood that a stage that can be very efficiently accelerated is necessary to be used. In FIG. 10A, relationship between the time necessary for the laser annealing and the scanning speed of the semiconductor film is shown. It is found that there is a minimum value, and a processing time at this time is substantially 2600 s. A plurality of laser oscillators may be used to improve a processing capacity.

Embodiment 1

Figure 8:
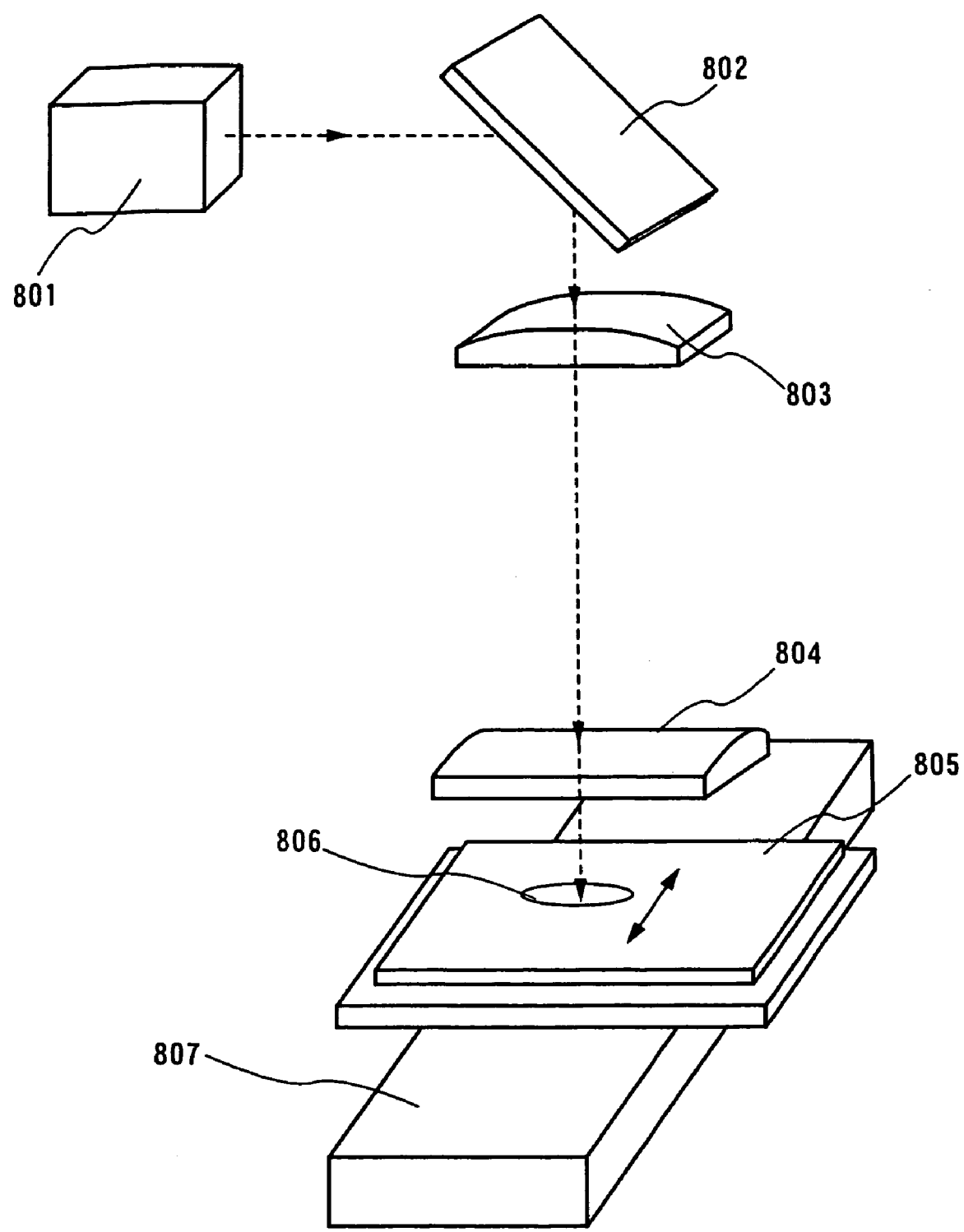
FIG. 8 is a diagram for explaining Embodiment 1.

In the present embodiment, in order to compare with the example explained in the implementation mode of the present invention, a case where the scanning speed is set at 50 cm/s will be explained with reference to FIG. 8. A laser oscillator 801 is a CW type 10 W $YVO_4$ laser. A nonlinear optical element is incorporated in a resonator, and second harmonics are emitted therefrom.

A laser beam emitted in a horizontal direction from the laser oscillator 801 is deflected by a mirror 802 into a vertical direction. Thereafter, the laser beam is converged into one direction with a cylindrical lens 803 having a focal length of 150 mm. Furthermore, with a cylindrical lens 804 disposed 100 mm behind the cylindrical lens 803 and having a focal length of 20 mm, the laser beam is converged in a direction that is perpendicular to the one direction and perpendicular to a direction into which the laser beam proceeds. A surface being illuminated 805 where a semiconductor film is disposed is disposed at a position of the focal point of the cylindrical lens 804. Thereby, an elliptical beam 806 having a length of 700 μm and a width of 30 μm can be formed. In the present embodiment, an example that is described in the implementation mode of the present invention and in which an a-Si film having a thickness of 150 nm is laser-annealed will be illustrated. In this case, a long grain region having a width of 250 nm is formed.

In order to closely pack the semiconductor film with the longer grain regions, while moving the elliptical beam by 250 μm in a major axis direction thereof, the elliptical beam is necessary to repeat to scan to a longer side direction of the substrate. This movement can be easily performed when an XY stage is employed. When a size of a semiconductor film that is a target to be illuminated is 600×720 mm, since a length of a shorter side of the substrate is 600 mm, the entire surface of the substrate can be laser-annealed by scanning 2400 times (1200 times reciprocating movement) with the elliptical beam. Furthermore, at this time, a condition where the scanning speed of 50 cm/s is the most efficient speed becomes substantially g=190 cm/s² from Equation 6). At acceleration to this extent, the substrate can be easily scanned. At this time, a processing time necessary to process one substrate is 4600 s. A plurality of laser oscillators may be used to improve a processing capacity.

Embodiment 2

Figure 9:
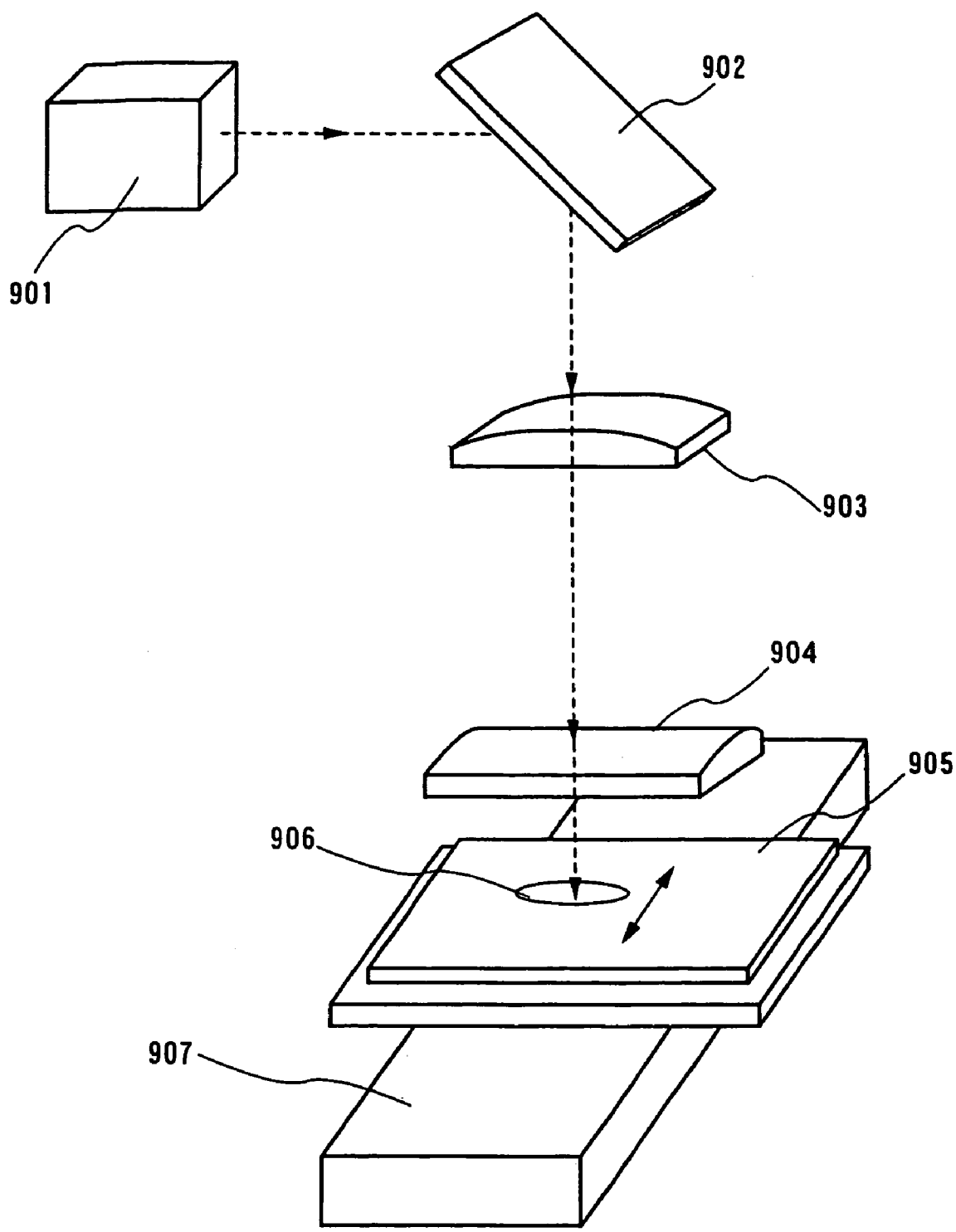
FIG. 9 is a diagram for explaining Embodiment 2.

In the present embodiment, in order to compare with the aforementioned example, an example where the scanning speed is set at 500 cm/s will be explained with reference to FIG. 9. A laser oscillator 901 is a continuous wave type 10 W YVO$_4$ laser. A non-linear optical element is incorporated in a resonator, and second harmonics are emitted therefrom.

A laser beam emitted in a horizontal direction from the laser oscillator 901 is deflected by a mirror 902 into a vertical direction. Thereafter, the laser beam is converged into one direction with a cylindrical lens 903 having a focal length of 160 mm. Furthermore, the laser beam is converged with a cylindrical lens 904 disposed 140 mm behind the cylindrical lens 903 and having a focal length of 20 mm into a direction perpendicular to the one direction and perpendicular to a direction into which the laser beam proceeds. The surface being illuminated 905 where the semiconductor film is disposed is disposed at the focal point of the cylindrical lens 904. Thereby, an elliptical beam 906 having a length of 250 μm and a width of 30 μm can be formed. In the present embodiment, an example where an a-Si film having a thickness of 150 nm whose fabricating method is described in the implementation mode of the present invention is laser-annealed will be shown. In this case, a long grain region having a width of 85 μm is formed.

In order to closely pack the semiconductor film with the longer grain regions, while moving the elliptical beam by 85 μm in a major axis direction thereof, the elliptical beam is necessary to repeat to scan to a longer side direction of the substrate. This movement can be easily performed when an XY stage is employed. When a size of a semiconductor film that is a target to be illuminated is 600×720 mm, since a length of a shorter side of the substrate is 600 mm, the entire surface of the substrate can be laser-annealed by scanning 7000 times with the elliptical beam. Furthermore, at this time, a condition where the scanning speed of 500 cm/s is the most efficient speed becomes substantially g=19000 cm/s² based on Equation 6. That is, acceleration further higher than the example shown in the implementation mode of the present invention is necessary. Since it is a fairly higher acceleration, in this case, rather than moving the semiconductor film, it is preferable to scan the laser beam with a mirror or the like. Furthermore, at this time, a time for processing one substrate is 1400 s, which is substantially one half that of the example according to the implementation mode of the present invention. On the other hand, since the scanning speed is more than three times, when compared with an increase rate of the scanning speed, the processing time does not earn a reduction rate corresponding to the increase rate of the scanning speed. A plurality of laser oscillators may be used to improve a processing capacity.

Embodiment 3

In Embodiment 3, an example of the crystallization of the semiconductor film performed by using the optical system of the present invention will be described with reference to FIG. 20.

First of all, a glass substrate made of glasses such as barium borosilicate glass and aluminum borosilicate glass, a substrate which has an insulating film on the surface such as a quartz substrate, a silicon substrate, a metal substrate or stainless substrate, can be used as a substrate 20. The substrate 20 may be a plastic substrate having a heat resistance sufficient to against the processing temperature in this embodiment.

Next, a base film 21 made of an insulating film such as silicon oxide film, silicon nitride film, and a silicon oxynitride film is formed on the substrate 20. In this embodiment, a single layer structure is used for the base film 21. However, a structure may be used where a two or more layers film are stacked. In this embodiment, a silicon oxynitride film (compositional ratio: Si=32%, O=59%, N=7% and H=2%) with a thickness of 110 nm is formed by the plasma CVD method.

Next, a semiconductor layer 22 is formed on the base film 21. The semiconductor layer 22 is formed with a thickness of 25 to 200 nm (preferably 30 to 150 nm) by publicly known method (such as the sputtering method, LPCVD method and plasma CVD method), and the semiconductor film 22 is crystallized by publicly known crystallization method (such as a laser crystallization method, a thermal crystallization method using RTA or a furnace annealing and a thermal crystallization method using a metal element facilitating the crystallization). As the semiconductor films, there are an amorphous semiconductor film, a microcrystalline semiconductor film, and a crystalline semiconductor film, a compound semiconductor film having an amorphous structure such as an amorphous silicon germanium film also can be applied therefor. In this embodiment, plasma CVD method is used to form an amorphous silicon film 150 nm thick. After the dehydrogenation is performed on this amorphous silicon film (at 500° C. for 3 hours), the laser crystallization method is performed to form the crystalline silicon film.

A continuous oscillation type laser such as an excimer laser and YAG laser, YVO$_4$ laser, YLF laser, YAlO$_3$ laser, glass laser, ruby laser, Ti: sapphire laser can be used for the laser crystallization method. When these lasers are used, a method in which the laser beam emitted from a continuous laser oscillation is condensed so as to have an ellipse shape or a rectangular shape by an optical system and the laser beam thereof illuminates the amorphous silicon film can be adopted. The crystallization conditions are suitably selected by an operator. In this embodiment, the laser crystallization is performed in accordance with examples shown in Implementation modes and Embodiment 1 and 2 of the present invention.

Since crystal grains in large size are formed in the crystalline semiconductor film 23 obtained as described above, it is possible to reduce the number of crystal boundaries which are may be included in the channel formation region by manufacturing TFTs with the semiconductor film.

Besides, since individual crystal grain substantially has a crystallinity regarded as monocrystal, it is possible to achieve a high mobility (field effect mobility) equal to or greater than that of a transistor employing a monocrystal semiconductor.

Further, since the obtained crystal grains are arranged in same direction, it is possible to extremely decrease the number of times when a carrier crosses the crystal grain boundaries, therefore, it also becomes possible to reduce fluctuation in an on current value (value of drain current flowing when a TFT is in an on state), an off current value (value of drain current flowing when a TFT is in an off state), a threshold voltage, an S value, and a field effect mobility. The electric characteristics also are improved.

Embodiment 4

In this embodiment, another method of obtaining the crystallization of semiconductor film which is different from the one shown in Embodiment 3 will be described with reference to FIG. 21.

As a semiconductor film, up to forming an amorphous silicon film is carried out in accordance with Embodiment 3. A metal containing layer 31 is formed by utilizing a method disclosed in Japanese Patent Application Laid Open No. 7-183540, after a thermal treatment is performed thereon, the crystallinity of semiconductor film is improved by the laser annealing method. In Embodiment 4, a nickel acetate aqueous solution (weight converting concentration: 5 ppm, volume: 10 ml) is applied onto the surface of the semiconductor film by spin coating to thereby, and thermal treatment (at 500° C. for 1 hour, at 550° C. for 12 hours) is performed on the semiconductor film. Continuously, in accordance with examples shown in Implementation modes and Embodiments 1 and 2, the crystallinity of the semiconductor film is improved by the laser annealing method.

As described above, since compare with crystal gains obtained in Embodiment 3, crystal gains obtained by performing crystallization utilizing the present invention on the semiconductor film is in a larger size, it is possible to reduce the number of crystal boundaries which are may be included in the channel formation region by manufacturing TFTs with the semiconductor film. Besides, since individual crystal grain substantially has a crystallinity regarded as monocrystal, it is possible to achieve a high mobility (field effect mobility) equal to or greater than that of a transistor employing a monocrystal semiconductor.

Further, since the obtained crystal grains are arranged in same direction, it is possible to extremely decrease the number of times when a carrier crosses the crystal grain boundaries, therefore, it also becomes possible to reduce fluctuation in an on current value, an off current value, a threshold voltage, an S value, and a field effect mobility. The electric characteristics also are improved remarkably.

Embodiment 5

In this embodiment, a method of manufacturing an active matrix substrate will be described with reference to FIGS. 11 to 14. A substrate on which a CMOS circuit, a driving circuit, and a pixel portion having a pixel TFT and a storage capacitor are formed together is called active matrix substrate for convenience.

First of all, a substrate 400 formed of glass such as barium borosilicate glass and aluminum borosilicate glass is used in this embodiment. The substrate 400 may be a quartz substrate, a silicon substrate, a metal substrate or stainless substrate, which has an insulating film on the surface. The substrate 400 may be a plastic substrate having heat resistance, which withstands a processing temperature in this embodiment.

Next, a base film 401 having an insulating film such as silicon oxide film, silicon nitride film, and a silicon oxynitride film is formed on the substrate 400. In this embodiment, a two-layer structure is used for the base film 401. However, a structure may be used where a single layer film, which is the insulating film itself, or at least two layers are stacked. As a first layer of the base film 401, a silicon oxynitride film 401a is formed 10 to 200 nm (preferably 50 to 100 nm) thick by using $SiH_4$, $NH_3$ and $N_2O$ as a reaction gas in accordance with the plasma CVD method. In this embodiment, a silicon oxynitride film 401a (compositional ratio: Si=32%, O=27%, N=24% and H=17%) was formed with a thickness of 50 nm. Next, as a second layer of the base film 401, a silicon oxynitride film 401b is formed with a thickness of 50 to 200 nm (preferably 100 to 150 nm) by using $SiH_4$ and $N_2O$ as a reaction gas in accordance with the plasma CVD method. In this embodiment, a silicon oxynitride film 401b (compositional ratio: Si=32%, O=59%, N=7% and H=2%) is formed with a thickness of 100 nm.

Next, a semiconductor film is formed on the base film. First of all, the semiconductor film is formed with a thickness of 25 to 200 nm (preferably 30 to 150 nm) by a publicly known method (such as the sputtering method, LPCVD method and plasma CVD method). Then the semiconductor film is crystallized by a publicly known crystallization method (such as laser crystallization method, thermal crystallization method using RTA or a furnace annealing and thermal crystallization method using a metal element facilitating the crystallization), in addition, publicly known crystallization method can be combined and used for the crystallization. The semiconductor film may be an amorphous semiconductor film, a fine crystal semiconductor film or a crystalline semiconductor film. Alternatively, the semiconductor film may be a compound semiconductor film having an amorphous structure such as an amorphous silicon germanium film.

As a laser using in the laser crystallization method, it is preferable to use a solid state laser, a gas laser, or a metal laser of continuous oscillation. It should be noted that as the foregoing solid state laser, YAG laser, $YVO_4$ laser, YLF laser, $YAlO_3$ laser, glass laser, ruby laser, alexandrite laser, Ti: sapphire laser or the like of continuous oscillation or are listed, as the foregoing gas laser, excimer laser, Ar laser, Kr laser, $CO_2$ laser or the like of continuous oscillation are listed, and as the foregoing metal laser, helium-cadmium laser, copper vapor laser, gold vapor laser and the like are listed.

In this embodiment, plasma CVD method is used to form an amorphous silicon film with a thickness of 150 nm, and then the thermal crystallization method using metallic elements, which promote crystallization, and laser crystallization method are used for the amorphous silicon film. Nickel is used as a metal element, and is introduced onto the amorphous silicon film by a solution coating method. Then heat treatment is conducted at 500° C. for five hour, whereby obtaining a first crystalline silicon film. Subsequently, the laser beam shot from a continuous oscillation $YVO_4$ laser with output 10 W is converted into the second higher harmonic wave by a nonlinear optical element and then a ellipse shape laser beam is formed and illuminated by the optical systems shown in FIGS. 1, 8 and 9 in accordance with Embodiments and Embodiments 1 and 2, whereby obtaining a second crystalline silicon film. Illuminating the laser beam to the first crystalline silicon film, and changing the first crystalline silicon film to the second crystalline silicon film improve the crystallinity of the second crystalline silicon film. At this moment, about 0.01 to 1.00 MW/cm$^2$. (preferably 0.1 to 10 MW/cm$^2$) is necessary for the energy density. The stage is relatively moved to the laser beam at a speed of about 0.5 to 2000 cm/s, and it illuminates, and then the crystalline silicon film is formed.

Of course, although a TFT can be formed by using the first crystalline silicon film, it is preferable that the second crystalline silicon film is used to form the TFT since the second crystalline silicon film has an improved crystallinity and electric characteristics of TFT are improved. For instance, although, when TFT is formed by using the first crystalline silicon film, a mobility is almost 300 cm$^2$/Vs, when TFT is formed by using the second crystalline silicon film, the mobility is extremely improved with about 500 to 600 cm$^2$/Vs.

The amorphous silicon film is crystallized by using a metal element facilitating the crystallization in this embodiment. Therefore, the metal element remains the crystalline silicon film. The metal element is removed as follows: First of all, an amorphous silicon film 50 to 100 nm thick is formed on the crystalline silicon film. Then, thermal processing (such as RTA method or thermal annealing using an annealing furnace) is performed thereon. Then, the metal element is diffused in the amorphous silicon film, and the amorphous silicon is removed by etching after heating processing. Thus, the metal element contained in the crystalline silicon film can be reduced or removed.

Doping of a very small amount of an impurity element (boron or phosphorous) may be performed after forming the semiconductor layers 402 to 406 in order to control a TFT threshold value.

A gate insulating film 407 is formed next, covering the semiconductor layers 402 to 406. The gate insulating film 407 is formed by an insulating film containing silicon with a thickness of 40 to 150 nm using plasma CVD or sputtering. In this embodiment, a silicon oxynitride film (compositional ratio: Si=32%, O=59%, N=7% and H=2%) having a film thickness of 110 nm is formed by plasma CVD method. The gate insulating film is of course not limited to a silicon oxynitride film, and other insulating films containing silicon may be used in a single layer or in a lamination structure.

Further, if a silicon oxide film is used, it can be formed by plasma CVD method with a mixture of TEOS (Tetraethyl Orthosilicate) and O$_2$, at a reaction pressure of 40 Pa, with the substrate temperature set from 300 to 400° C., and by discharging at a high frequency (13.56 MHz) electric power density of 0.5 to 0.8 W/cm$^2$. Good characteristics as a gate insulating film can be obtained by subsequently performing thermal annealing, at between 400 and 500° C., of the silicon oxide film thus manufactured.

A first conductive film 408 having a film thickness of 20 to 100 nm, and a second conductive film 409 having a film thickness of 100 to 400 nm are then formed and laminated on the gate insulating film 407. The first conductive film 408, made from a TaN film having a film thickness of 30 nm, and the second conductive film 409, made from a W film having a film thickness of 370 nm, are formed and laminated in this embodiment. The TaN film is formed by sputtering, and sputtering of a Ta target is performed in a nitrogen atmosphere. Further, the W film is formed by sputtering using a W target. In addition, the W film can also be formed by thermal CVD method using tungsten hexafluoride (WF$_6$). Whichever is used, it is necessary to be able to make the film become low resistance in order to use it as a gate electrode, and it is preferable that the resistivity of the W film be made less than 20 μΩcm. The low resistance of the W film can be achieved by increasing the size of the crystal grains. However, when the W film contains a large amount of impurity element such as oxygen, the crystallization is inhibited, which raises the resistance. Accordingly, in this embodiment, the W film is formed by the sputtering method using high purity (purity of 99.9999%) W target and by taking the prevention of intrusion of impurity from a vapor phase during the film forming into special consideration. Thus, the resistivity of 9 to 20 μΩcm can be achieved.

Note that although the first conductive film 408 is TaN and the second conductive film 409 is W in this embodiment, there are no particular limitations placed on the conductive films. The first conductive film 408 and the second conductive film 409 may also be formed from an element selected from the group consisting of Ta, W, Ti, Mo, Al, Cu, Cr, and Nd, or from an alloy material having one of these elements as its main constituent, or from a chemical compound of these elements. Further, a semiconductor film, typically a polycrystalline silicon film, into which an impurity element such as phosphorous is doped may also be used, as may an AgPdCu alloy. A combination of the first conductive film formed by a tantalum (Ta) film and the second conductive film formed by a W film, a combination of the first conductive film formed by a titan nitride (TiN) and the second conductive film formed by a W film, a combination of the first conductive film formed by a tantalum nitride (TaN) film and the second conductive film formed by an Al film, or a combination of the first conductive film formed by a tantalum nitride (TaN) film and the second conductive film formed by a Cu film is possible.

Masks 410 to 415 are formed next from resist using a photolithography method, and a first etching process is performed in order to form electrodes and wirings. The first etching processing is performed in accordance with first and second etching conditions (FIG. 11B). An ICP (Inductively Coupled Plasma) etching method is used as a first etching condition in this embodiment. A gas mixture of CF$_4$, Cl$_2$, and O$_2$ is used as an etching gas, the gas flow rates are set to 25:25:10 (sccm), respectively, a plasma is generated by supplying a 500 W RF (13.56 MHz) electric power to a coil shape electrode at a pressure of 1 Pa, and etching is performed. A 150 W RF (13.56 MHz) electric power is also applied to the substrate side (sample stage), thereby applying a substantially negative self-bias voltage. The W film is etched under the first etching conditions, and the edge portion of the first conductive layer is made into a tapered shape.

The etching conditions are changed to a second etching condition without removing the masks 410 to 415 made of resist. A gas mixture of CF$_4$ and Cl$_2$ is used as an etching gas, the gas flow rates are set to 30:30 (sccm), respectively, a plasma is generated by applying a 500 W RF (13.56 MHz) electric power to a coil shape electrode at a pressure of 1 Pa, and etching is performed for approximately 30 seconds. A 20 W RF (13.56 MHz) electric power is also supplied to the substrate side (sample stage), thereby applying a substantially negative self-bias voltage. The W film and the TaN film are both etched by on the same order by the second etching conditions using the gas mixture of CF$_4$ and Cl$_2$. Note that the etching time may be increased on the order of 10 to 20% in order to perform etching such that no residue remains on the gate insulating film.

Edge portions of the first conductive layer and the second conductive layer are made into a tapered shape in accordance with the effect of a bias voltage, applied to the substrate side, by making the shapes of the resist masks suitable with the above-mentioned first etching condition. The angle of the tapered portions is from 15 to 45°. First shape conductive layers 417 to 422 (first conductive layers 417a to 422a, and second conductive layers 417b to 422b) are thus formed from the first conductive layers and the second conductive layers by the first etching process. Reference numeral 416 denotes a gate insulating film, and regions not covered by the first shape conductive layers 417 to 422 become thinner by approximately 20 to 50 nm through etching.

A second etching process is then performed without removing the masks made of resist (FIG. 11C). Here, W film is selectively etched by using $CF_4$, $Cl_2$, and $O_2$ for the etching gas. At this time, the second conductive layers 428b to 433b are formed by the second etching process. On the other hand, the first conductive layers 417a to 422a are hardly etched and the second shape conductive layers 428 to 433 are formed.

A first doping process is then performed without removing the masks made of resist and the semiconductor layer is added to the impurity element which imparts n-type at a low concentration. The doping process may be performed by ion doping method or ion injection method. Ion doping is performed with process conditions in which the dosage is set from $1 \times 10^{13}$ to $5 \times 10^{14}/cm^2$, and the acceleration voltage is set between 40 to 80 keV. Doping is performed in this embodiment with the dosage set to $1.5 \times 10^{13}/cm^2$, and the acceleration voltage set to 60 keV. An element belonging to the group 15, typically phosphorous (P) or arsenic (As) is used as an impurity element which imparts n-type. Phosphorous (P) is used here. In this case the conductive layers 428 to 433 act as masks with respect to the impurity element which imparts n-type conductivity, and the impurity regions 423 to 427 are formed in a self-aligning manner. The impurity element which imparts n-type is added to the impurity regions 423 to 427 at a concentration in a range of $1 \times 10^{18}$ to $1 \times 10^{20}/cm^3$.

Next, after removing the masks made of resist, new masks 434a to 434c made of resist are formed, and the second doping process is performed in higher acceleration voltage than the first doping process. Ion doping is performed with process conditions in which the dosage is set from $1 \times 10^{13}$ to $1 \times 10^{15}/cm^2$, and the acceleration voltage is set between 60 to 120 keV. The doping process is performed by using the second conductive layers 428b to 432b as masks and the semiconductor layer under the tapered portion of the first conductive layer is added to the impurity element. Continuously the acceleration voltage is lowered than the second doping process, the third doping process is done, and the state of FIG. 12A is obtained. Ion doping method is performed with process conditions in which the dosage is set from $1 \times 10^{15}$ to $1 \times 10^{17}/cm^2$, and the acceleration voltage is set between 50 to 100 keV. Low concentration impurity regions 436, 442 and 448 overlapping with the first conductive layer are added to the impurity element, which imparts n-type within the range of the density of $1 \times 10^{18}$ to $5 \times 10^{19}/cm^2$ by the second doping process and the third doping process and high concentration impurity regions 435, 441, 444 and 447 are added to the impurity element, which imparts n-type within the range of the density of $1 \times 10^{19}$ to $5 \times 10^{21}/cm^2$.

Of course, the second doping process and the third doping process can be one-time doping processes by making it to a suitable acceleration voltage and it is also possible to form the low concentration impurity region and high concentration impurity region.

Next, after removing the masks made of resist, new masks 450a to 450c made from resist are formed and the fourth doping process is performed. Impurity regions 453, 454, 459 and 460, to which an impurity element which imparting a conductivity type opposite to that of the above one conductivity type is added, are formed in accordance with the fourth doping process in the semiconductor films which become active layers of the p-channel type TFTs. The second conductive layers 429b to 432b are used as masks with respect to the impurity element, and an impurity element which imparts p-type conductivity is added to form the impurity regions in a self-aligning manner. The impurity regions 453, 454, 459 and 460 are formed by ion doping method using diborane ($B_2H_6$) in this embodiment (FIG. 12B). The semiconductor layers for forming the n-channel type TFT are covered with the masks 450a to 450c made of resist when the fourth doping process is performed. Phosphorous is added at different concentrations into the impurity regions 439, 447 and 448 by the first to third doping processes. However, by performing doping such that the concentration of the impurity element which imparts p-type conductivity becomes from $1 \times 10^{19}$ to $5 \times 10^{21}$ atoms/$cm^3$ in the respective regions, no problems develop in making the regions function as source regions and drain regions of the p-channel type TFT.

The impurity regions are thus formed in the respective semiconductor layers by the steps up through this point.

A first interlayer insulating film 461 is formed next after removing the masks 450a to 450c made of resist. This first interlayer insulating film 461 is formed from an insulating film containing silicon, having a thickness of 100 to 200 nm, by using plasma CVD method or sputtering method. A silicon oxynitride film having a thickness of 150 nm is formed by plasma CVD method in this embodiment. The first interlayer insulating film 461 is of course not limited to a silicon oxynitride film, and other insulating films containing silicon may also be used, as a single layer or a lamination structure.

Next, as shown in FIG. 12C, thermal processing is performed to recover the crystalline characteristic of the semiconductor layers and to activate the impurity element added to each of the semiconductor layer. The heating processing is performed by thermal annealing method using an annealing furnace. The thermal annealing method may be performed in an atmosphere of nitrogen with the oxygen density of 1 ppm or below, preferably 0.1 ppm or below, at 400 to 700° C., typically at 500 to 550° C. In this embodiment, the activation processing is performed through thermal processing at 550° C. for four hours. In addition to the thermal annealing method, laser annealing method or rapid thermal annealing method (RTA method) may be applied.

Alternatively, the heating processing may be performed before the first interlayer insulating film is formed. However, when a wiring material in use is sensitive to heat, the activation processing is preferably performed after an interlayer insulating film (insulating film mainly containing silicon such as silicon nitride film) for protecting the wires like this embodiment.

After the heating processing (thermal processing at 300 to 550° C. for one to 12 hours) is performed, hydrogenation can be performed. This process terminates the dangling bond of the semiconductor layer with hydrogen contained in the first interlayer insulating film 461. Alternatively, as other means of hydrogenation, plasma hydrogenation (using hydrogen excited by plasma) or heating processing in an atmosphere containing 3 to 100% of hydrogen at 300 to 450° C. for 1 to 12 hours may also be performed.

Subsequently, a second interlayer insulating film 462 made from an inorganic insulating film material or from an organic insulating material is formed on the first interlayer insulating film 461. An acrylic resin film having a film thickness of 1.6 µm is formed in this embodiment, and the material used may have a viscosity from 10 to 1000 cp, preferably between 40 to 200 cp. A material in which unevenness is formed on its surface is used.

In order to prevent mirror reflection, the surface of a pixel electrode is made uneven by forming a second interlayer insulating film which forms an uneven surface in this embodiment. Further, the pixel electrode surface can be made to be uneven and have light scattering characteristics, and therefore a convex portion may also be formed in a region below the pixel electrode. The formation of the convex portion can be performed by the same photomask as that for forming the TFTs, and therefore it can be formed without increasing the number of process steps. Note that the convex portion may also be formed appropriately on the substrate of the pixel portion region except the wirings and TFTs. In this way, unevenness is formed in the surface of the pixel electrode along the unevenness formed in the surface of the insulating film which covers the convex portion.

A film having a level surface may also be used as the second interlayer insulating film 462. In this case, it is preferable that the surface be made uneven by an added process such as a known sandblasting process or etching process to prevent mirror reflection, and thereby increasing whiteness by scattering reflected light.

Figure 13:
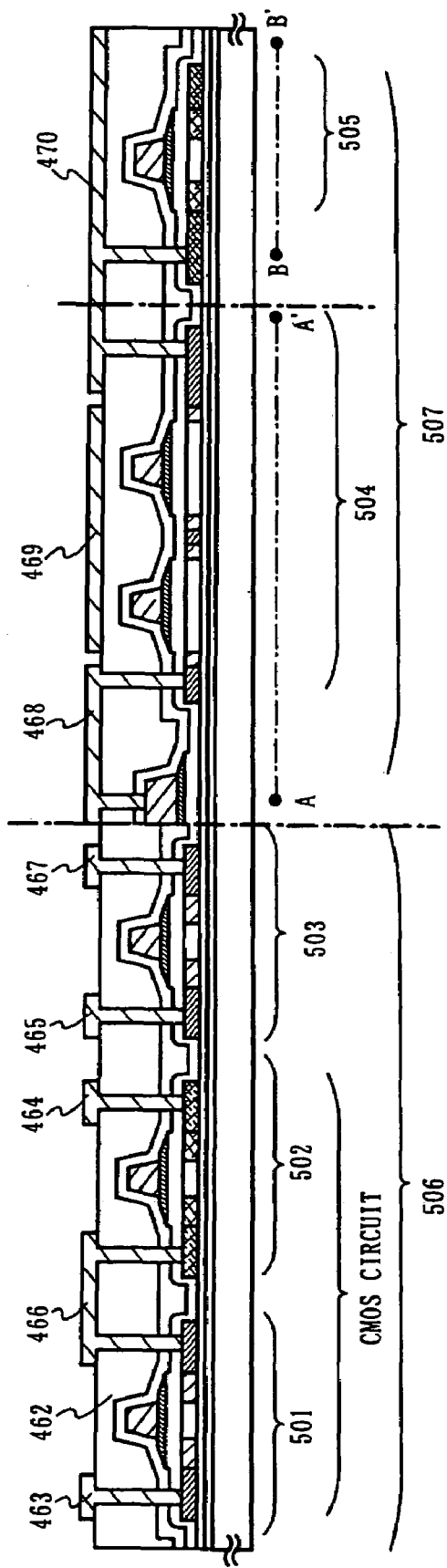
FIG. 13 is a sectional view showing a process for fabricating a pixel TFT and driver circuit TFT.

Wirings 463 to 467 for electrically connecting respective impurity regions are then formed in a driver circuit 506. Note that a lamination film of a Ti film having a thickness of 50 nm and an alloy film (an alloy of Al and Ti) having a thickness of 500 nm is patterned in order to form the wirings. Of course, it is not limited to the two-layer structure, the single-layer structure or the lamination structure more than three layers may also be acceptable. Further, Al and Ti are not limited to the wiring material. For example, Al and Cu are formed on TaN film, and the lamination film forming the Ti film is formed by the patterning and form wiring (FIG. 13).

Further, a pixel electrode 470, a gate wiring 469, and a connection electrode 468 are formed in a pixel portion 507. An electrical connection is formed with the pixel TFT and the source wiring by the connection electrode 468. Further, the gate wiring 469 forms an electrical connection with the gate electrode of the pixel TFT. The pixel electrode 470 forms an electrical connection with the drain region 442 of the pixel TFT, and in addition, forms an electrical connection with the semiconductor layer 459 which functions as one electrode forming a storage capacitor. It is preferable to use a material having superior reflectivity, such as a film having Al or Ag as its main constituent, or a lamination film of such films, as the pixel electrode 470.

A CMOS circuit composed of an n-channel TFT 501 and a p-channel TFT 502, a driver circuit 506 having an n-channel TFT 503, and the pixel portion 507 having a pixel TFT 504 and a storage capacitor 505 can thus be formed on the same substrate. The active matrix substrate is thus completed.

The n-channel TFT 501 of the driver circuit 506 has: a channel forming region 437; the low concentration impurity region 436 (GOLD region) which overlaps with the first conductive layer 428a that structures a portion of the gate electrode; and the high concentration impurity region 452 which functions as a source region or a drain region. The p-channel TFT 502, which forms the CMOS circuit with the n-channel TFT 501 and the electrode 466 by an electrical connection has: a channel forming region 440; the high concentration impurity region 453 which functions as a source region or a drain region; and the impurity region 454 in which the impurity elements imparting n-type and p-type are introduced. Further, the n-channel TFT 503 has: a channel forming region 443; the low concentration impurity region 442 (GOLD region) which overlaps with the first conductive layer 430a that structures a portion of the gate electrode; and the high concentration impurity region 456 which functions as a source region or a drain region.

The pixel TFT 504 of the pixel portion has: a channel forming region 446; a low concentration impurity region 445 (LDD region) formed on the outside of the gate electrode; and a high concentration impurity region 458 which functions as a source region or a drain region. Further, an impurity element which imparts n-type and an impurity element which imparts p-type are added to the semiconductor layer which functions as one electrode of the storage capacitor 505. The storage capacitor 505 comprises an electrode (lamination of 432a and 432b) and the semiconductor layer, with the insulating film 416 functioning as a dielectric.

Edge portions of the pixel electrodes are disposed so as to overlap with source wirings such that gaps between the pixel electrodes shield the light, without using a black matrix, with the pixel structure of this embodiment.

Figure 14:
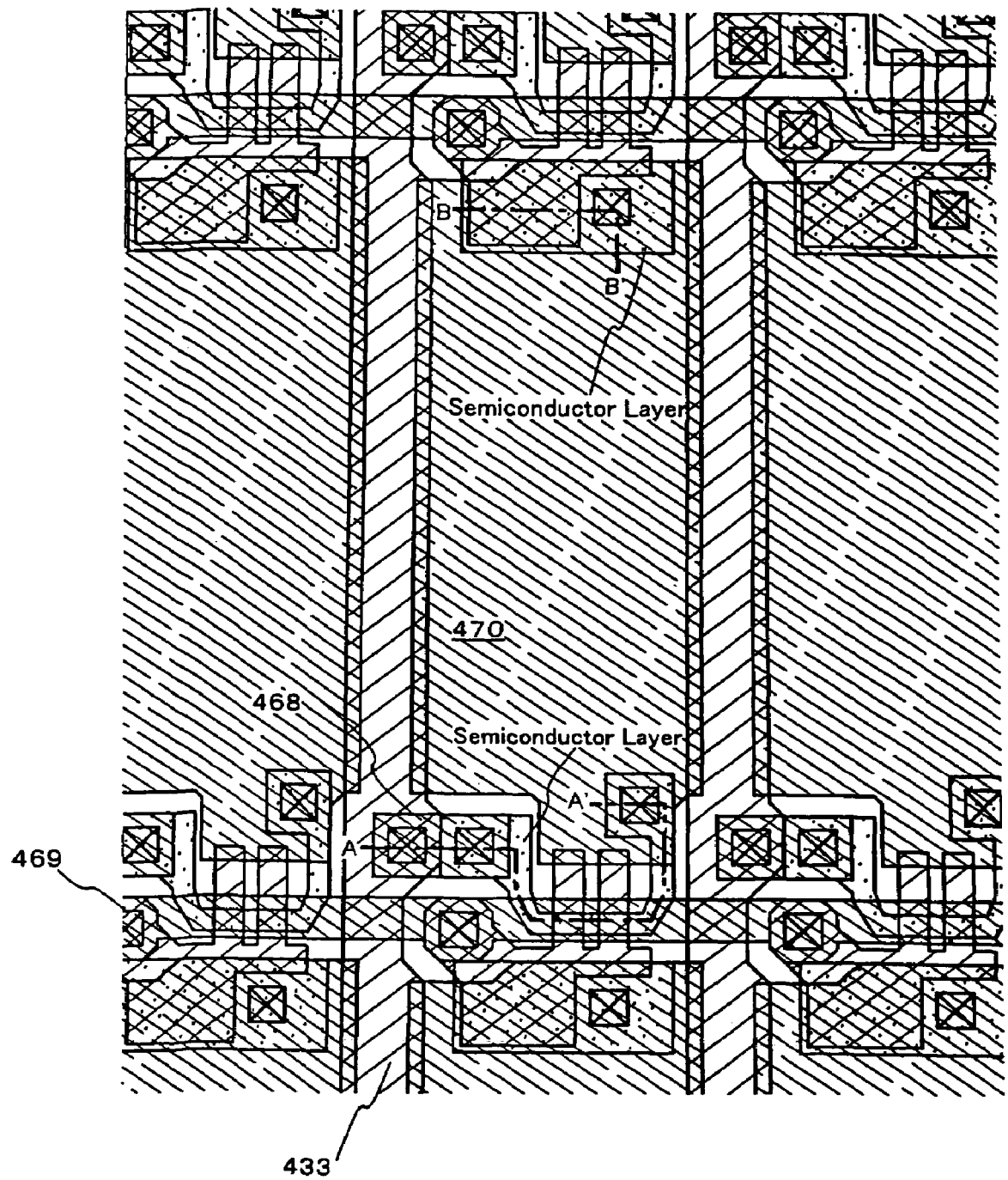
FIG. 14 is a top view showing a configuration of a pixel TFT.

An upper surface diagram of the pixel portion of the active matrix substrate manufactured in this embodiment is shown in FIG. 14. Note that the same reference symbols are used for portions corresponding to those in FIGS. 11 to 14. A chain line A-A' in FIG. 13 corresponds to a cross sectional diagram cut along a chain line A-A' within FIG. 14. Further, a chain line B-B' in FIG. 13 corresponds to a cross sectional diagram cut along a chain line B-B' within FIG. 14.

Note that Embodiment 5 can be freely combined with anyone of Embodiments 1 to 4.

Embodiment 6

Figure 15:
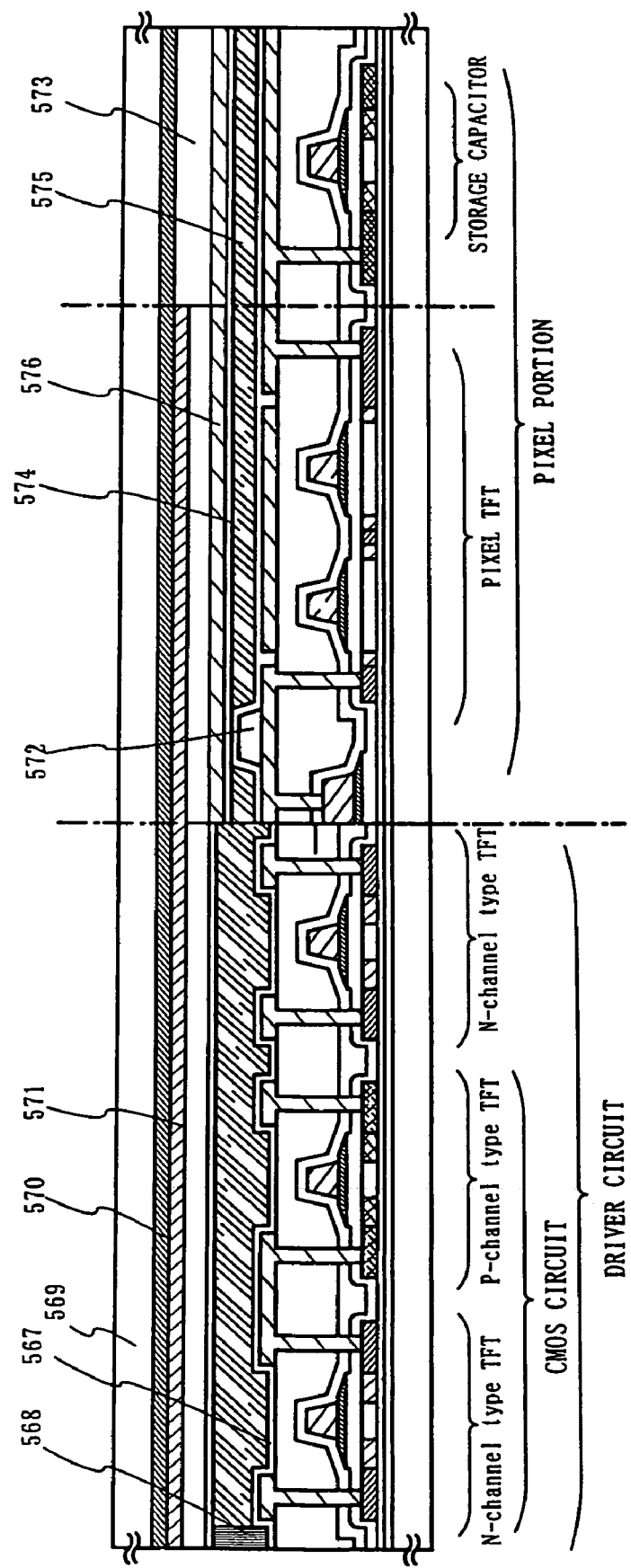
FIG. 15 is a sectional view of an active matrix type liquid crystal display device.

A process of manufacturing a reflection type liquid crystal display device from the active matrix substrate manufactured in Embodiment 5 is explained below in this embodiment. FIG. 15 is used in the explanation.

An active matrix substrate in the state of FIG. 13 is first obtained in accordance with Embodiment 5, an orientation film 567 is then formed on at least the pixel electrode 470 on the active matrix substrate of FIG. 13, and a rubbing process is performed. Note that, before forming the orientation film 567 in this embodiment, columnar spacer 572 is formed in desired positions by patterning an organic resin film, such as an acrylic resin film and the like, in order to maintain a gap between substrates. Further, spherical spacers may also be distributed over the entire surface of the substrate as a substitute for the columnar spacers.

An opposing substrate 569 is prepared next. Coloring layers 570 and 571, and a leveling film 573 are then formed on the opposing substrate 569. The red coloring layer 570 and a blue coloring layer 571 are overlapped to form a light shielding portion. Furthermore, the light shielding portion may also be formed by overlapping a portion of the red coloring layer with a green coloring layer.

The substrate shown in Embodiment 5 is used in this embodiment. Therefore, with the top view of the pixel portion of Embodiment 5 shown in FIG. 14, it is necessary that, at least, the gap between the gate wiring 469 and the pixel electrode 470, the gap between the gate wiring 469 and the connection electrode 468, and the gap between the connection electrode 468 and the pixel electrode 470 be shielded from light. Each of the coloring layers are arranged such that the light shielding portions made from the lamination of the coloring layers are formed in positions that must be shielded from light, and then are joined to the opposing substrate.

It is thus made possible to reduce the number of process steps by performing light shielding of the respective gaps between the pixels by using the light shielding portions, composed of the laminations of the coloring layers, without forming a light shielding layer such as a black mask and the like.

An opposing electrode 576 made from a transparent conductive film is formed on the leveling film 573 over at least the pixel portion, an orientation film 574 is formed over the entire surface of the opposing substrate, and a rubbing process is performed.

The active matrix substrate on which the pixel portion and the driver circuit are formed, and the opposing substrate are then joined by a sealing material 568. A filler is mixed into the sealing material 568, and the two substrates are joined while maintaining a uniform gap in accordance with the filler and the columnar spacers. A liquid crystal material 575 is then injected between both substrates, and the substrates are completely sealed by using a sealant (not shown in the figure). A known liquid crystal material may be used for the liquid crystal material 575. The reflection type liquid crystal display device shown in FIG. 15 is thus completed. The active matrix substrate or the opposing substrate is then cut into a desired shape if necessary. In addition, a polarizing plate (not shown in the figure) is attached to only the opposing substrate. An FPC is then attached using a known technique.

A liquid crystal display panel manufactured as described above can be used as a display portion in various kinds of electronic equipment. Note that it is possible to freely combine this embodiment with Embodiments 1 to 5.

Embodiment 7

In this embodiment, an example of manufacturing the light emitting device by using a manufacturing method of TFT that is used for forming an active matrix substrate. In this specification, the light emitting device is the general term for the display panel enclosed a light emitting element formed on the substrate between the aforesaid substrate and the cover member, and to the aforesaid display module equipped TFT with the aforesaid display panel. Incidentally, the light emitting element has a layer including a compound in which an electroluminescence can be obtained by applying an electric field (a light emitting layer), an anode, and a cathode. Meanwhile, the electroluminescence in organic compound includes the light emission (fluorescence) upon returning from the singlet-excited state to the ground state and the light emission (phosphorescence) upon returning from the triplet-excited state to the ground state, including any or both of light emission.

In this specification, all layers formed between the anode and the cathode in the light emitting element are defined as the organic light emitting layer. The light emitting layer, the hole injection layer, the electron injection layer, the hole transportation layer, and the electron transportation layer, etc. are concretely included in the organic light emitting layer. The light emitting element basically has the structure that the anode layer, the light emitting layer, and the cathode layer are sequentially laminated. In addition to this structure, the light emitting element may also has a structure that the anode layer, the hole injection layer, the light emitting layer, and the cathode layer are sequentially laminated or a structure that the anode layer, the hole injection layer, the light emitting layer, the hole transportation layer, and the cathode layer etc. are sequentially laminated.

Figure 16:
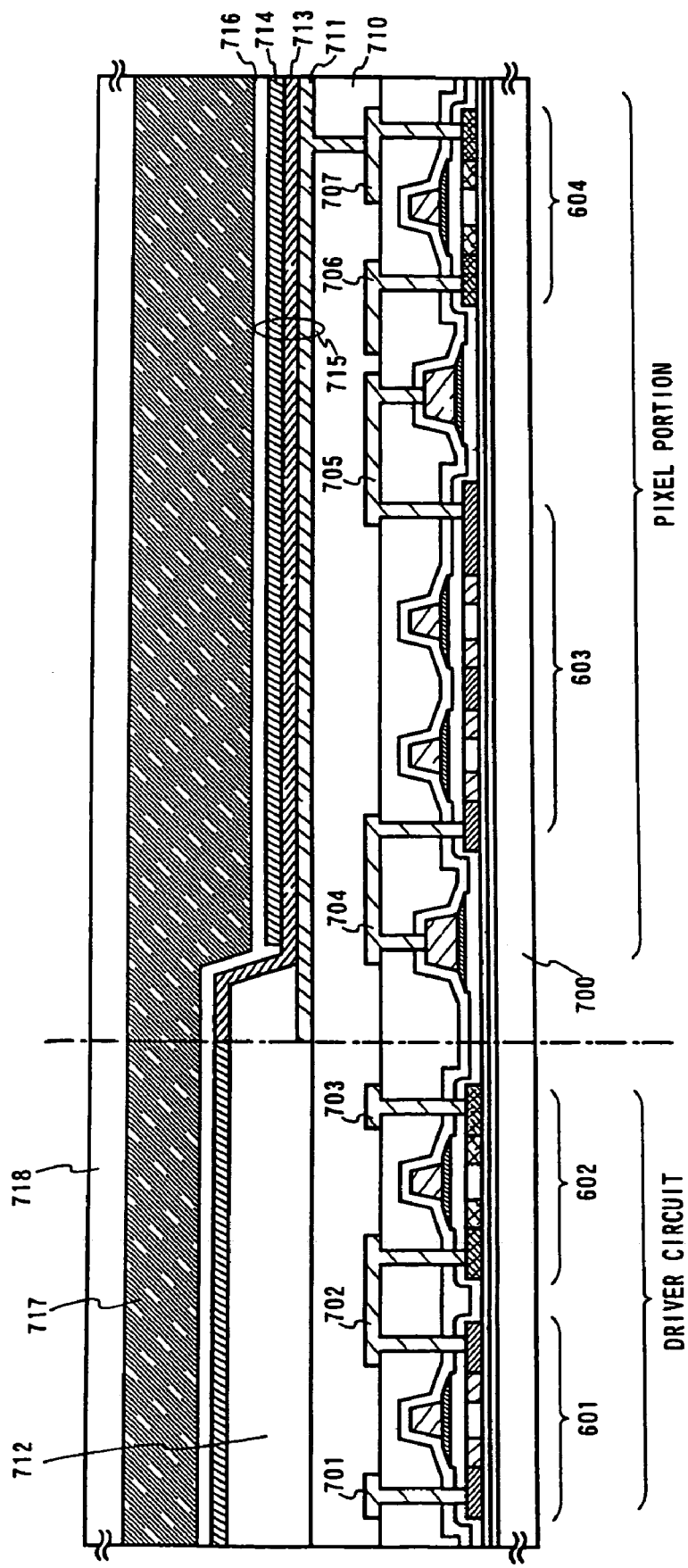
FIG. 16 is a sectional schematic view of a driver circuit and a pixel portion of a light-emitting device.

FIG. 16 is a sectional view of a light emitting device of this embodiment. In FIG. 16, the switching TFT 603 provided on the substrate 700 is formed by using the n-channel TFT 503 of FIG. 13. Consequently, concerning the explanation of the structure, it is satisfactory to refer the explanation on the n-channel TFT 503.

Incidentally, although this embodiment is of a double gate structure formed with two channel regions, it is possible to use a single gate structure formed with one channel region or a triple gate structure formed with three.

The driver circuit provided on the substrate 700 is formed by using the CMOS circuit of FIG. 13. Consequently, concerning the explanation of the structure, it is satisfactory to refer the explanation on the n-channel TFT 501 and p-channel TFT 502. Incidentally, although this embodiment is of a single gate structure, it is possible to use a double gate structure or a triple gate structure.

Meanwhile, the wirings 701, 703 serve as source wirings of the CMOS circuit while the wiring 702 as a drain wiring. Meanwhile, a wiring 704 serves as a wiring to electrically connect between the source wiring 708 and the source region of the switching TFT while the wiring 705 serves as a wiring to electrically connect between the drain wiring 709 and the drain region of the switching TFT.

Incidentally, a current control TFT 604 is formed by using the p-channel TFT 502 of FIG. 13. Consequently, concerning the explanation of the structure, it is satisfactory to refer to the explanation on the p-channel TFT 502. Incidentally, although this embodiment is of a single gate structure, it is possible to use a double gate structure or a triple gate structure.

Meanwhile, the wiring 706 is a source wiring of the current control TFT (corresponding to a current supply line) while the wiring 707 is an electrode to be electrically connected with a pixel electrode 711 of the current control TFT by overlapping under the pixel electrode 711.

Meanwhile, reference numeral 711 is a pixel electrode (anode of a light-emitting element) formed by a transparent conductive film. As the transparent conductive film can be used a compound of indium oxide and tin oxide, a compound of indium oxide and zinc oxide, zinc oxide, tin oxide or indium oxide, or otherwise may be used a transparent conductive film as above added with gallium. The pixel electrode 711 is formed on a planar interlayer insulating film 710 prior to forming the wirings. In this embodiment, it is very important to planarize the step due to the TFT by using a resin planarizing film 710. A light-emitting layer to be formed later, because being extremely small in thickness, possibly causes poor light emission due to the presence of a step. Accordingly, it is desired to provide planarization prior to forming a pixel electrode so that a light-emitting layer can be formed as planar as possible.

After forming the wirings 701 to 707, a bank 712 is formed as shown in FIG. 16. The bank 712 may be formed by patterning an insulating film or organic resin film containing silicon having 100 to 400 nm.

Incidentally, because the bank 712 is an insulating film, caution must be paid to element electrostatic breakdown during deposition. In this embodiment added is a carbon particle or metal particle to an insulating film as a material for the bank 712, thereby reducing resistivity and suppressing occurrence of static electricity. In such a case, the addition amount of carbon or metal particle may be adjusted to provide a resistivity of $1\times10^6$ to $1\times10^{12}$ Ωm (preferably $1\times10^8$ to $1\times10^{10}$ Ωm).

A light emitting layer 713 is formed on the pixel electrode 711. Incidentally, although FIG. 16 shows only one pixel, this embodiment separately forms the light-emitting layer correspondingly to the respective colors of R (red), G (green) and B (blue). Meanwhile, in this embodiment is formed a low molecular weight organic light emitting material by the deposition process. Specifically, this is a lamination structure having a copper phthalocyanine (CuPc) film provided in a thickness of 20 nm as a hole injecting layer and a tris-8-qyuinolinolato aluminum complex ($Alq_3$) film provided thereon in a thickness of 70 nm as a light-emitting layer. The color of emission light can be controlled by adding a fluorescent pigment, such as quinacridone, perylene or DCM1, to $Alq_3$.

However, the foregoing example is an example of organic light emitting material to be used for a light-emitting layer and not necessarily limited to this. It is satisfactory to form a light-emitting layer (layer for light emission and carrier movement therefore) by freely combining a light-emitting layer, a charge transporting layer and an electron injecting layer. For example, although in this embodiment was shown the example in which a low molecular weight organic light emitting material is used for a light-emitting layer, it is possible to use an intermediate organic light emitting material and a high molecular weight organic light emitting material. Furthermore, an organic light-emitting material, having no sublimation property but having molecules in the number of 20 or less or chained molecules having a length of 10 μm or less, is provided as a intermediate molecular organic light emitting material. For an example of using the high molecular weight organic light emitting material, a polythiophene (PEDOT) film with a thickness of 20 nm is formed by the spin coating method as a hole injection layer and the lamination structure installing paraphenylenvinylene (PPV) of about 100 nm on it as a light emitting layer may be good. The luminescence wave length can be selected from red to blue by using the π-conjugated type polymer of PPV. Meanwhile, it is possible to use an inorganic material such as silicon carbide for an electron transporting layer or charge injecting layer. These organic light emitting materials or inorganic materials can be a known material.

Next, a cathode 714 of a conductive film is provided on the light-emitting layer 713. In this embodiment, an alloy film of aluminum and lithium is used as the conductive film. Of course, a known MgAg film (alloy film of magnesium and silver) may be used. As the cathode material may be used a conductive film of an element belonging to the periodic-table group 1 or 2, or a conductive film added with such an element.

A light-emitting element 715 is completed at a time having formed up to the cathode 714. Incidentally, the light-emitting element 715 herein refers to a diode formed with a pixel electrode (anode) 711, a light-emitting layer 713 and a cathode 714.

It is effective to provide a passivation film 716 in such a manner to completely cover the light-emitting element 715. The passivation film 716 is formed by an insulating film including a carbon film, a silicon nitride film or a silicon oxynitride film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range not more than 100° C. from room temperature, can be easily deposited over the light-emitting layer 713 low in heat resistance. Meanwhile, the DLC film, having a high blocking effect to oxygen, can suppress the light-emitting layer 713 from oxidizing. Consequently, the problem of oxidation can be prevented in the light-emitting layer 713 during the following sealing process.

Furthermore, a sealing member 717 is provided on the passivation film 716 so as to bond a cover member 718. For the sealing member 717 used may be an ultraviolet curable resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof.

Thus, completed is a light emitting device having a structure as shown in FIG. 16. Incidentally, it is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFTs 601, p-channel TFTs 602, a switching TFT (n-channel TFT) 603 and a current control TFT (p-channel TFT) 604 are formed on the substrate 700.

Furthermore, as was explained using FIG. 16, by providing an impurity region overlapped with the gate electrode through an insulating film, it is possible to form an n-channel TFT resistive to the deterioration resulting from hot-carrier effect. Consequently, a light emitting device with high reliability can be realized.

Meanwhile, this embodiment shows only the configuration of the pixel portion and driver circuit. However, according to the manufacturing process in this embodiment, besides these, it is possible to form on the same insulating member such logic circuits as a signal division circuit, a D/A converter, an operation amplifier, a γ-correction circuit or the like. Furthermore, a memory or microprocessor can be formed.

A liquid crystal display panel manufactured as described above can be used as a display portion in various kinds of electronic equipment. Note that it is possible to freely combine this embodiment with Embodiments 1 to 5.

Embodiment 8

Various semiconductor devices (active matrix type liquid crystal display device, active matrix type light emitting device or active matrix type EC display device) can be formed by applying the present invention. Specifically, the present invention can be embodied in electronic equipment of any type in which such an electro-optical device is incorporated in a display portion.

Such electronic equipment is a video camera, a digital camera, a projector, a head-mounted display (goggle type display), a car navigation system, a car stereo, a personal computer, a mobile information terminal (such as a mobile computer, a mobile telephone or an electronic book etc.) or the like. FIGS. 17A to 17F, 18A to 18D and 19A to 19C show some of its examples.

Figure 17A:
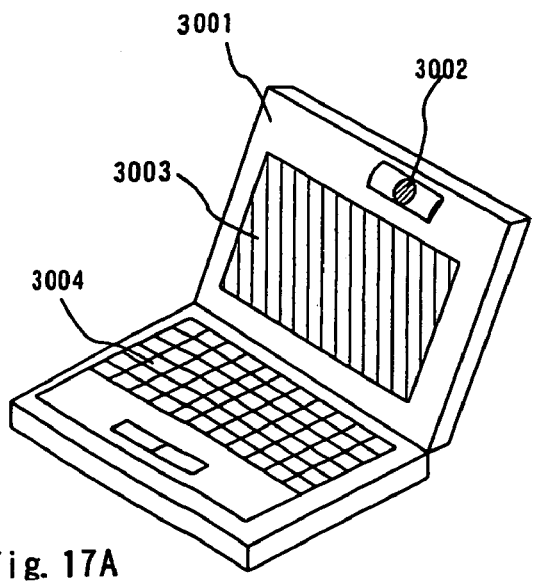
FIGS. 17A through 17F are diagrams showing examples of semiconductor devices.

FIG. 17A shows a personal computer which includes a main body 3001, an image input portion 3002, a display portion 3003, a keyboard 3004 and the like. The personal computer of the present invention can be completed by applying the semiconductor device manufactured by the present invention to the display portion 3003.

Figure 17B:
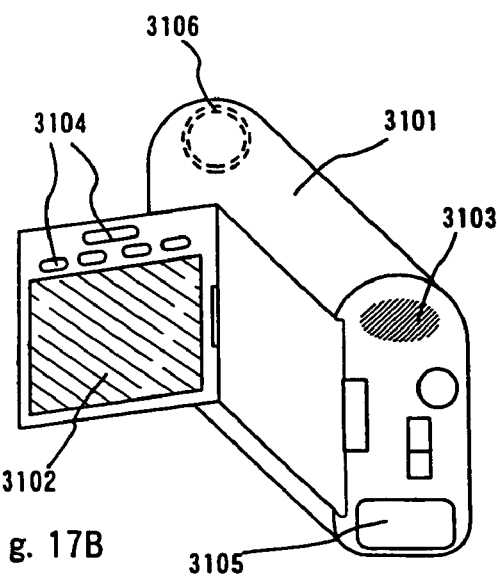

FIG. 17B shows a video camera which includes a main body 3101, a display portion 3102, a sound input portion 3103, operating switches 3104, a battery 3105, an image receiving portion 3106 and the like. The video camera of the present invention can be completed by applying the semiconductor device manufactured by the present invention to the display portion 3102.

Figure 17C:
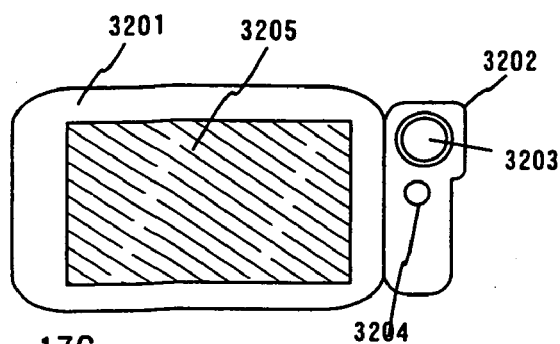

FIG. 17C shows a mobile computer which includes a main body 3201, a camera portion 3202, an image receiving portion 3203, an operating switch 3204, a display portion 3205 and the like. The mobile computer of the present invention can be completed by applying the semiconductor device manufactured by the present invention to the display portion 3205.

Figure 17D:
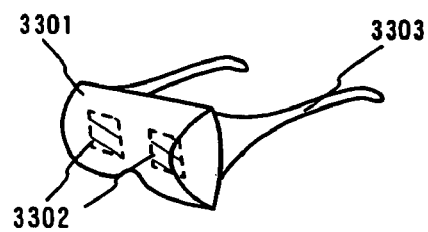

FIG. 17D shows a goggle type display which includes a main body 3301, a display portion 3302, arm portions 3303 and the like. The goggle type display of the present invention can be completed by applying the semiconductor device manufactured by the present invention to the display portion 3302.

Figure 17E:
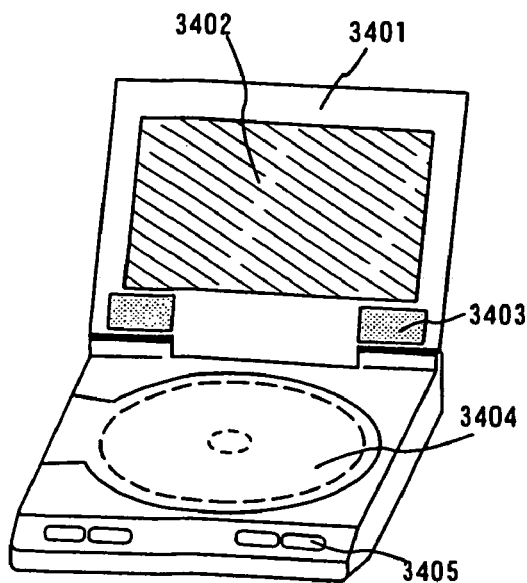

FIG. 17E shows a player using a recording medium on which a program is recorded (hereinafter referred to as the recording medium), and the player includes a main body 3401, a display portion 3402, speaker portions 3403, a recording medium 3404, operating switches 3405 and the like. This player uses a DVD (Digital Versatile Disc), a CD and the like as the recording medium, and enables a user to enjoy music, movies, games and the Internet. The recording medium of the present invention can be completed by applying the semiconductor device manufactured by the present invention to the display portion 3402.

Figure 17F:
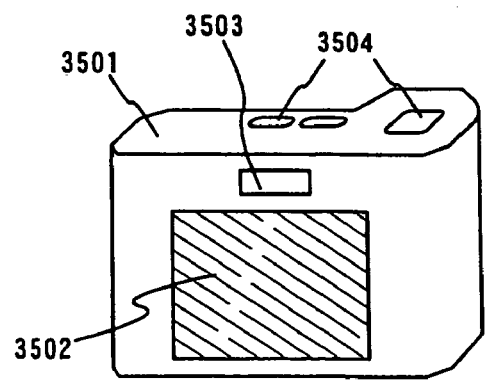

FIG. 17F shows a digital camera which includes a body 3501, a display portion 3502, an eyepiece portion 3503, operating switches 3504, an image receiving portion (not shown) and the like. The digital camera of the present invention can be completed by applying the semiconductor device manufactured by the present invention to the display portion 3502.

Figure 18A:
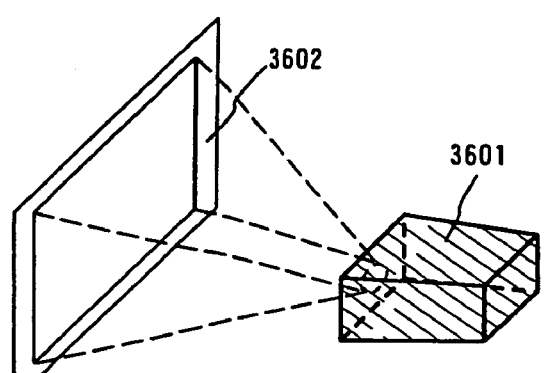
FIGS. 18A through 18D are diagrams showing examples of semiconductor devices.

FIG. 18A shows a front type projector which includes a projection device 3601, a screen 3602 and the like. The front type projector can be completed by applying the semiconductor device manufactured by the present invention to a liquid crystal display device 3808 which constitutes a part of the projection device 3601, and other driver circuits.

Figure 18B:
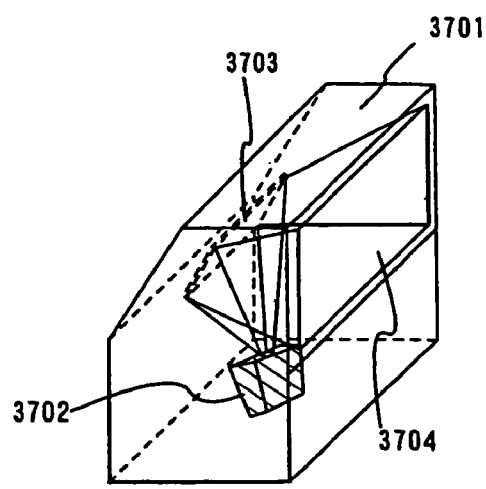

FIG. 18B shows a rear type projector which includes a main body 3701, a projection device 3702, a mirror 3703, a screen 3704 and the like. The rear type projector can be completed by applying the semiconductor device manufactured by the present invention to a liquid crystal display device 3808 which constitutes a part of the projection device 3702, and other driver circuits.

Figure 18C:
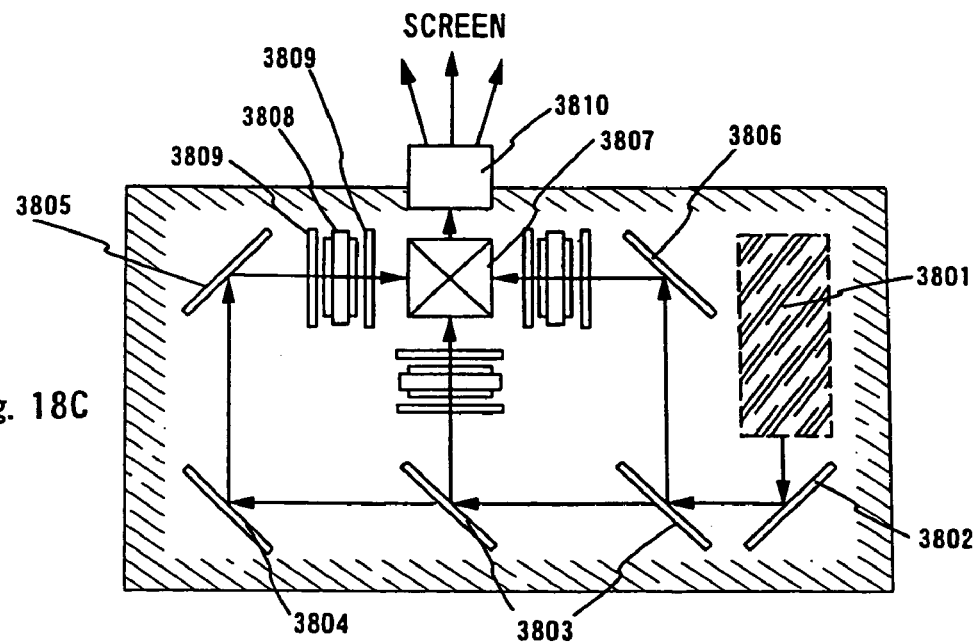

FIG. 18C shows one example of the structure of each of the projection devices 3601 and 3702 which are respectively shown in FIGS. 18A and 18B. Each of the projection devices 3601 and 3702 is made of a light source optical system 3801, mirrors 3802 and 3804 to 3806, a dichroic mirror 3803, a prism 3807, a liquid crystal display device 3808, a phase difference plate 3809 and a projection optical system 3810. The projection optical system 3810 is made of an optical system including a projection lens. Present embodiment is an example of a three-plate type, but it is not limited to this example and may also be of a single-plate type. In addition, those who embody the invention may appropriately dispose an optical system such as an optical lens, a film having a polarization function, a film for adjusting phase difference, an IR film or the like in the path indicated by arrows in FIG. 18C.

Figure 18D:
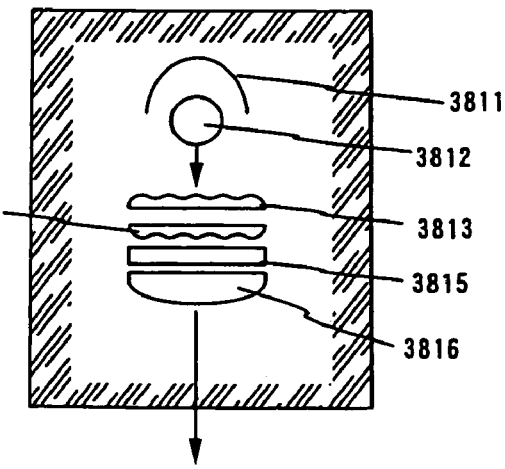

FIG. 18D is a view showing one example of the structure of the light source optical system 3801 shown in FIG. 18C. In this embodiment, the light source optical system 3801 is made of a reflector 3811, a light source 3812, lens arrays 3813 and 3814, a polarizing conversion element 3815 and a condenser lens 3816. Incidentally, the light source optical system shown in FIG. 18D is one example, and the invention is not particularly limited to the shown construction. For example, those whose embody the invention may appropriately dispose an optical system such as an optical lens, a film having a polarization function, a film for adjusting-phase difference, an IR film or the like.

The projector shown in FIGS. 18A to 18D is of the type using a transparent type of electro-optical device, but there is not shown an example in which the invention is applied to a reflection type of electro-optical device and a light emitting device.

Figure 19A:
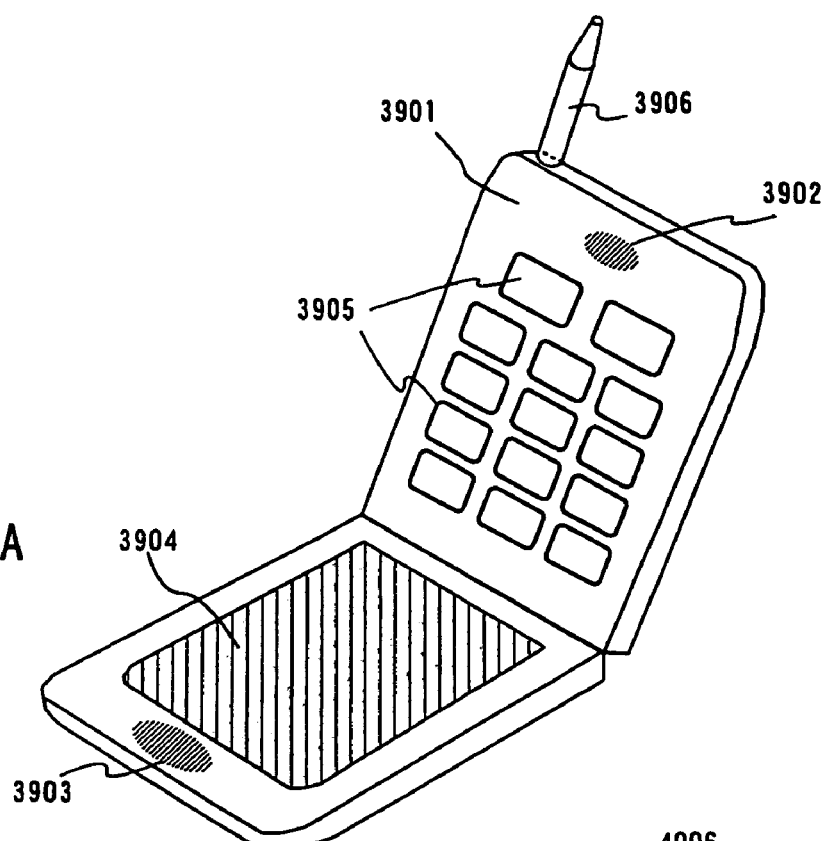
FIGS. 19A through 19C are diagrams showing examples of semiconductor devices.

FIG. 19A shows a mobile telephone which includes a main body 3901, a sound output portion 3902, a sound input portion 3903, a display portion 3904, operating switches 3905, an antenna 3906 and the like. The mobile telephone of the present invention can be completed by applying the semiconductor device manufactured by the present invention to the display portion 3904.

Figure 19B:
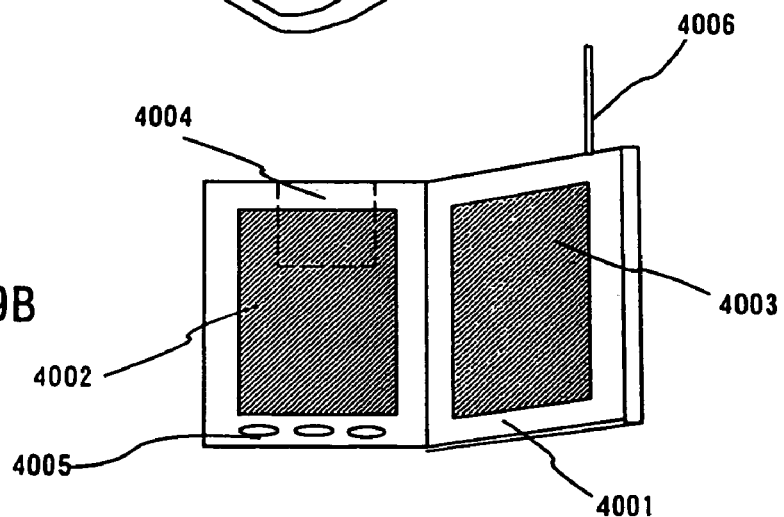

FIG. 19B shows a mobile book (electronic book) which includes a main body 4001, display portions 4002 and 4003, a storage medium 4004, operating switches 4005, an antenna 4006 and the like. The mobile book of the present invention can be completed by applying the semiconductor device manufactured by the present invention to the display portions 4002 and 4003.

Figure 19C:
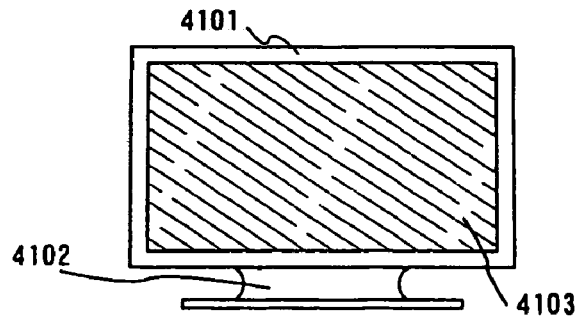

FIG. 19C shows a display which includes a main body 4101, a support base 4102, a display portion 4103 and the like. The display of the present invention can be completed by applying the semiconductor device manufactured by the present invention to the display portion 4103. The invention is particularly advantageous to a large-screen display, and is advantageous to a display having a diagonal size of 10 inches or more (particularly, 30 inches or more).

As is apparent from the foregoing description, the range of applications of the invention is extremely wide, and the invention can be applied to any category of electronic apparatus. Electronic apparatus according to the invention can be realized by using a construction made of a combination of arbitrary ones of Embodiments 1 to 6 and 7.

Effect of the Invention

When the configurations of the present invention are adopted, the following essential advantages can be obtained.

(a) When semiconductor film crystallization apparatus that uses a CW laser is designed, according to equations shown by the present invention, appropriate acceleration properties of a stage can be easily grasped in advance. This is similar even when a plurality of lasers of the same kind or a plurality of lasers of different kinds are used.

(b) When the CW laser is used according to equations with which the present invention complies, semiconductor films having characteristics close to a single crystal can be obtained with a high throughput. When a plurality of lasers of the same kind or a plurality of lasers of different kinds are used, much higher throughput can be obtained.

(c) Since the laser does not so much heat the substrate on which the semiconductor film is deposited, when the present process is used, for instance on a plastic substrate, the semiconductor films having characteristics close to a single crystal can be formed with a high throughput. When a plurality of lasers of the same kind or a plurality of lasers of different kinds are used, much higher throughput can be obtained.

(d) Since a scanning speed that makes a time necessary for the laser annealing minimum does not depend on a laser output, the present invention can be easily applied to any kind of laser oscillators.

(e) In addition to the above, in a semiconductor device typical in an active matrix type liquid crystal display device, an improvement in operational characteristics and reliability of the semiconductor device can be realized.

What is claimed is:

1. A method for fabricating a semiconductor device comprising the step of:
   forming a semiconductor film over a substrate; and
   crystallizing the semiconductor film by irradiating a laser beam,
   wherein the irradiation is performed by scanning the semiconductor film with the laser beam at a relative scanning speed V,
   wherein, when acceleration necessary to attain the scanning speed V is g and a length of one side of a substrate on which the semiconductor film is formed is b, the scanning speed V satisfies $(gb/5.477)^{1/2}/2 < V < 2(gb/5.477)^{1/2}$.

2. A method for fabricating a semiconductor device comprising the step of:
   forming a semiconductor film over a substrate; and
   crystallizing the semiconductor film by irradiating a laser beam,
   wherein the irradiation is performed by scanning the semiconductor film with the laser beam at a relative scanning speed V,
   wherein, when acceleration necessary to attain the scanning speed V is g and a length of one side of a substrate on which the semiconductor film is formed is b, the scanning speed V satisfies $0.9 \ (gb/5.477)^{1/2} < V < 1.1 \ (gb/5.477)^{1/2}$.

3. A method for fabricating a semiconductor device according to any one of claims 1 and 2, wherein the laser beam is processed with an optical system so that the shape thereof on the substrate or in the neighborhood thereof is elliptical or rectangular.

4. A method for fabricating a semiconductor device according to any one of claims 1 and 2, wherein the laser beam is radiated from a continuous wave laser, said continuous wave laser being one selected from the group consisting of solid laser, gas laser, and metal laser.

5. A method for fabricating a semiconductor device according to any one of claims 1 and 2, wherein the laser beam is radiated from a continuous wave laser, said continuous wave laser being one selected from the group consisting of YAG laser, $YVO_4$ laser, YLF laser, $YAlO_3$ laser, $Y_2O_3$ laser, glass laser, ruby laser, alexandrite laser, and Ti: sapphire laser.

6. A method for fabricating a semiconductor device according to any one of claims 1 and 2, wherein the laser beam is radiated from a continuous wave laser, said continuous wave laser being one selected from the group consisting of excimer laser, Ar laser, Kr laser, and $CO_2$ laser.

7. A method for fabricating a semiconductor device according to any one of claims 1 and 2, wherein the laser beam is radiated from a continuous wave laser, said continuous wave laser being one selected from the group consisting of helium-cadmium laser, copper vapor laser, and gold vapor laser.

8. A method for fabricating a semiconductor device according to any one of claims 1 and 2, wherein the laser beam is modulated into higher harmonics with a non-linear optical element.

9. A method for fabricating a semiconductor device according to any one of claims 1 and 2, wherein one side of the substrate is a longer side of the substrate.

10. A method for fabricating a semiconductor device according to any one of claims 1 and 2, wherein a dimension of the substrate is any one of 300 mm×400 mm, 550 mm×650 mm, (600 mm to 620 mm)×720 mm, 730 mm×920 mm, 1000 mm×1200 mm, and 1150 mm×1350 mm.

11. A method for fabricating a semiconductor device according to any one of claims 1 and 2, wherein the semiconductor film is a silicon-containing film.

* * * * *